United States Patent
Gupta et al.

(10) Patent No.: US 9,966,194 B2
(45) Date of Patent: May 8, 2018

(54) MEMS ELECTROSTATIC ACTUATOR DEVICE FOR RF VARACTOR APPLICATIONS

(71) Applicant: Texas Instruments Incorporated, Dallas, TX (US)

(72) Inventors: Arun Gupta, Dallas, TX (US); William C. McDonald, Allen, TX (US); Adam Fruehling, Plano, TX (US); Ivan Kmecko, Plano, TX (US); Lance Barron, Arlington Heights, TX (US); Divyanshu Agrawal, Richardson, TX (US); Arthur M. Turner, Allen, TX (US); John C. Ehmke, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/385,431

(22) Filed: Dec. 20, 2016

(65) Prior Publication Data
US 2017/0098509 A1 Apr. 6, 2017

Related U.S. Application Data

(60) Division of application No. 15/044,016, filed on Feb. 15, 2016, now Pat. No. 9,573,801, which is a
(Continued)

(51) Int. Cl.
*H01L 27/20* (2006.01)
*H01L 29/84* (2006.01)
(Continued)

(52) U.S. Cl.
CPC ............. *H01G 5/16* (2013.01); *B81B 7/008* (2013.01); *H01G 5/011* (2013.01); *H01G 5/40* (2013.01);
(Continued)

(58) Field of Classification Search
CPC ................ B81C 1/00158; H01L 29/84; H01L 2924/1461; H01L 2924/3025; B81B 7/008
(Continued)

(56) References Cited

U.S. PATENT DOCUMENTS 6,504,118 B2   1/2003   Hyman et al.
6,533,947 B2   3/2003   Nasiri et al.
(Continued)

OTHER PUBLICATIONS

Farinelli, Paola et al., "A Wide Tuning Range MEMS Varactor Based on a Toggle Push-Pull Mechanism", Microwave Integrated Circuit Conference, Oct. 2008, Amsterdam, Netherlands, pp. 474-477.
(Continued)

*Primary Examiner* — Theresa T Doan
(74) *Attorney, Agent, or Firm* — Jacqueline J. Garner; Charles A. Brill; Frank D. Cimino

(57) ABSTRACT

A MEMs actuator device and method of forming includes arrays of actuator elements. Each actuator element has a moveable top plate and a bottom plate. The top plate includes a central membrane member and a cantilever spring for movement of the central membrane member. The bottom plate consists of two RF signal lines extending under the central membrane member. A MEMs electrostatic actuator device includes a CMOS wafer, a MEMs wafer, and a ball bond assembly. Interconnections are made from a ball bond to an associated through-silicon-via (TSV) that extends through the MEMS wafer. A RF signal path includes a ball bond electrically connected through a TSV and to a horizontal feed bar and from the first horizontal feed bar vertically into each column of the array. A metal bond ring extends between the CMOS wafer and the MEMs wafer. An RF grounding loop is completed from a ground shield
(Continued)

overlying the array to the metal bond ring, a TSV and to a ball bond.

19 Claims, 29 Drawing Sheets

Related U.S. Application Data continuation-in-part of application No. 14/691,962, filed on Apr. 21, 2015, now Pat. No. 9,263,973, which is a continuation of application No. 13/614,936, filed on Sep. 13, 2012, now Pat. No. 9,040,854.

(60) Provisional application No. 62/132,580, filed on Mar. 13, 2015, provisional application No. 61/606,041, filed on Mar. 2, 2012, provisional application No. 61/534,157, filed on Sep. 13, 2011.

(51) Int. Cl.
  *H01G 5/16* (2006.01)
  *H01G 5/40* (2006.01)
  *H01G 5/011* (2006.01)
  *B81B 7/00* (2006.01)

(52) U.S. Cl.
  CPC ......... *B81B 2201/0221* (2013.01); *B81B 2203/0118* (2013.01); *B81B 2203/0127* (2013.01); *B81B 2207/012* (2013.01); *B81B 2207/096* (2013.01)

(58) Field of Classification Search
  USPC .................................... 257/254, 415
  See application file for complete search history.

(56) References Cited

U.S. PATENT DOCUMENTS

| | | | |
|---|---|---|---|
| 6,760,144 B2 | 7/2004 | Hill et al. | |
| 6,822,370 B2 | 11/2004 | Clark et al. | |
| 7,295,726 B1 | 11/2007 | Milanovic et al. | |
| 7,428,353 B1 | 9/2008 | Milanovic et al. | |
| 7,432,788 B2 | 10/2008 | Glukh et al. | |
| 8,139,280 B2 | 3/2012 | Wu | |
| 8,171,804 B2 | 5/2012 | Knipe | |
| 8,179,215 B2 * | 5/2012 | Cohn | B81B 7/0077 200/181 |
| 8,274,200 B2 | 9/2012 | Zhang et al. | |
| 8,368,153 B2 * | 2/2013 | Huang | B81B 7/0061 257/414 |
| 8,488,230 B2 | 7/2013 | Smith et al. | |
| 8,576,029 B2 * | 11/2013 | Kishore | H01H 1/0036 200/181 |
| 8,729,770 B1 | 5/2014 | Milanovic | |

OTHER PUBLICATIONS

Solazzi, Francesco et al., "Active Recovering Mechanism for High Performance RF MEMS Redundancy Switches", Proceedings of the 40th European Microwave Conference, Sep. 28-30, 2010, Paris, France, pp. 93-96.

* cited by examiner

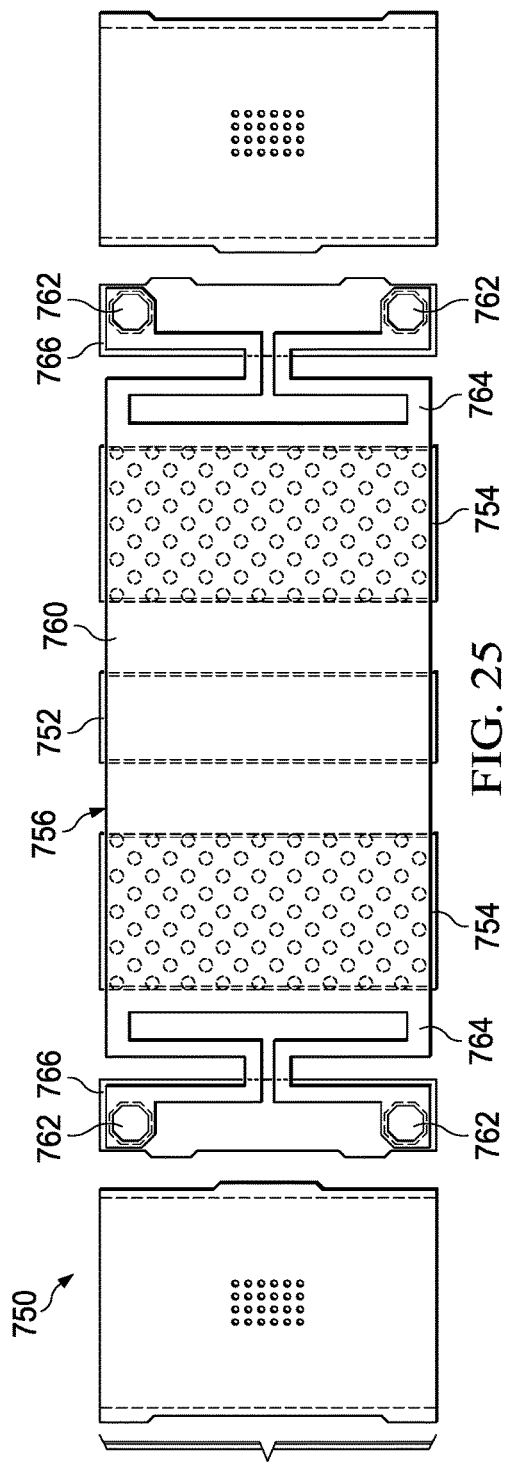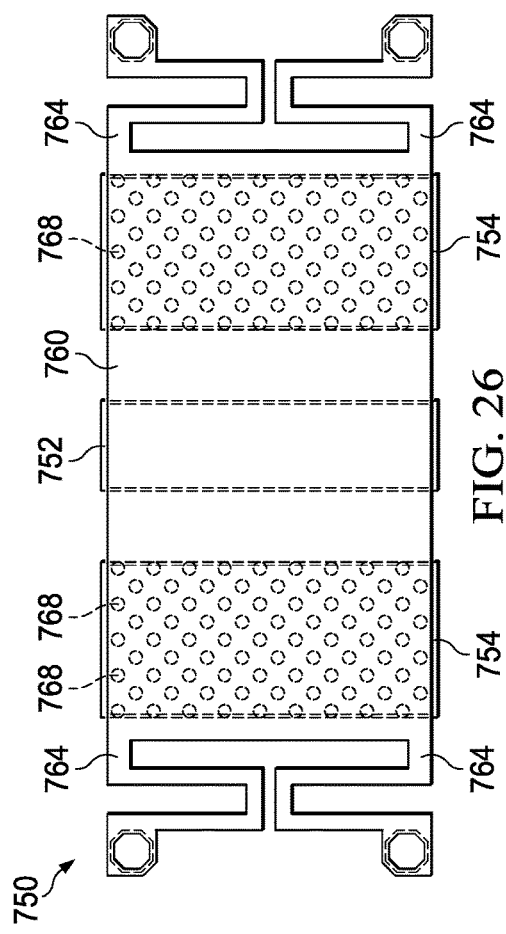

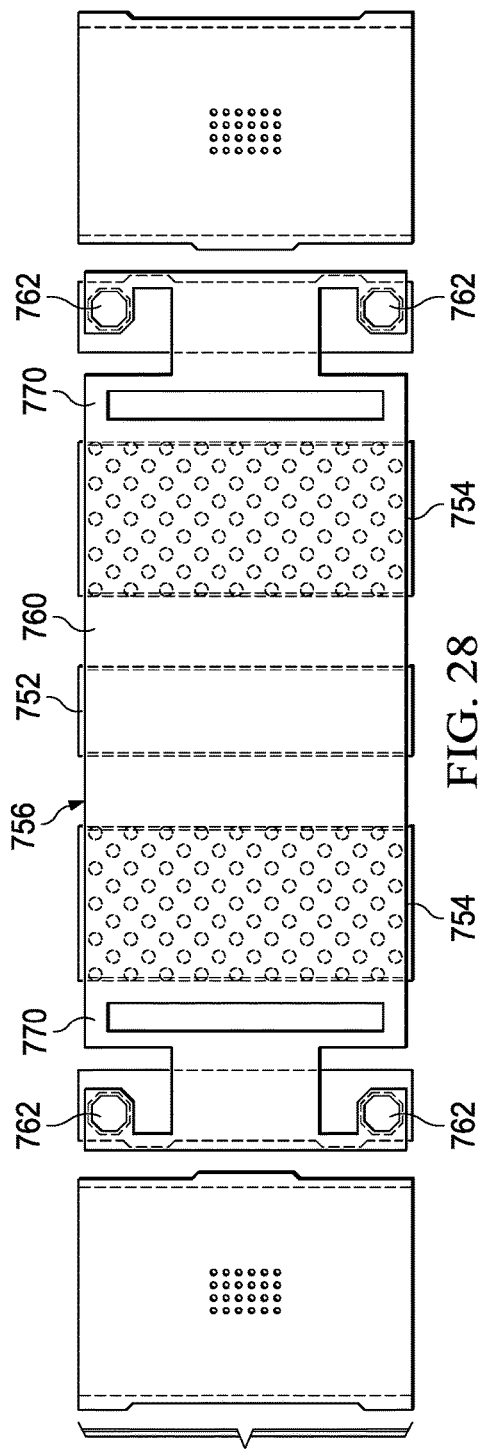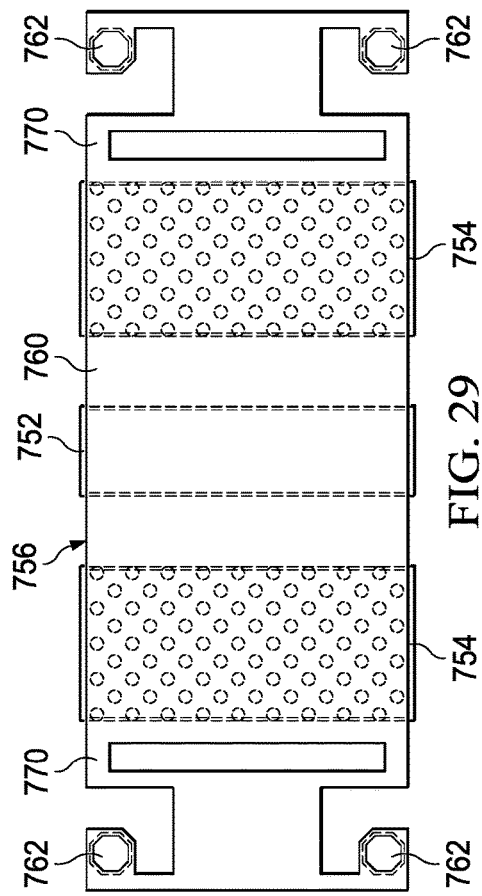

MEMS ELECTROSTATIC ACTUATOR DEVICE FOR RF VARACTOR APPLICATIONS

CROSS REFERENCE TO RELATED APPLICATIONS

This application is a divisional of U.S. Nonprovisional patent application Ser. No. 15/044,016, filed Feb. 15, 2016, which claims the benefit of U.S. Provisional Application No. 62/132,580, filed Mar. 13, 2015, and is a continuation-in-part of U.S. patent application Ser. No. 14/691,962, filed Apr. 21, 2015, (now U.S. Pat. No. 9,263,973, issued Feb. 16, 2016), which is a continuation of U.S. patent application Ser. No. 13/614,936, filed Sep. 13, 2012, (now U.S. Pat. No. 9,040,854, issued May 26, 2015), which claims benefit of U.S. Provisional Application No. 61/606,041, filed Mar. 2, 2012, and U.S. Provisional Application No. 61/534,157, filed Sep. 13, 2011, the contents of all of which are herein incorporated by reference in its entirety.

FIELD OF THE INVENTION

This relates to microelectromechanical system (MEMS) devices fabricated using microelectronic device fabrication processes such as semiconductor processing techniques used in the fabrication of integrated circuits and the like.

BACKGROUND

Relevant devices to which this disclosure finds application include MEMS electrostatic actuators (also known as capacitive actuators) which have a first electrode (bottom plate) fixed to a substrate and a second electrode (top plate) supported in elevated position above the substrate for selective controllable movement toward and away from the first electrode. A voltage applied between the electrodes creates an attractive force, drawing the electrodes together. Applying an opposing voltage and/or a mechanical spring action creates a restorative force, driving the electrodes apart. A thin layer of dielectric material applied over the first electrode prevents shorting.

Additional background is described in Gupta et al. application Ser. No. 13/614,936 "MEMS ELECTROSTATIC ACTUATOR" filed Sep. 13, 2013, the entirety of which is incorporated by reference herein.

SUMMARY

A MEMs electrostatic actuator device includes one or more arrays of actuator elements. Each actuator element has a moveable top plate and a bottom plate. The top plate includes a central membrane member and a cantilever spring for movement of the central membrane member. The bottom plate consists of two RF signal lines extending under the central membrane member.

A MEMs electrostatic actuator device includes a portion of a CMOS wafer, a portion of a MEMs high resistivity wafer, and a ball bond assembly. The MEMS wafer has an array of actuate elements formed thereon. Interconnections are made from a ball bond to an associated through-silicon-via (TSV) that extends through the high resistivity MEMS wafer. A first RF Signal ball bond is electrically connected through a first RF Signal TSV and on a first horizontal feed bar located above an array of actuator elements and from the first horizontal feed bar vertically down into each column of the array. A second RF Signal ball bond may be electrically connected from a second RF signal TSV to a second horizontal feed bar located below the array and from the second horizontal feed bar vertically up into each column of the array. CMOS circuitry interconnections proceed from a CMOS circuitry TSV to a post that extends between the MEMs wafer portion to the CMOS wafer portion. The MEMS electrostatic actuator device may further include a metal bond ring extending between the CMOS wafer portion and the MEMS wafer portion. The metal bond ring surrounds the array of actuator elements. A GND signal ball bond is electrically connected through a GND TSV and the metal bond ring to the CMOS wafer portion to provide an RF grounding loop. A ground shield on a side of the CMOS wafer portion facing the MEMS wafer portion may also be included. The ground shield extends over the entire array of actuator elements and is electrically connected to the metal bond ring to form part of the RF grounding loop.

A method of forming an actuator element of an array of actuator elements in a MEMS electrostatic actuator device comprises the steps of forming first and second RF electrodes on the surface of a MEMS wafer. The method may also include forming a first dielectric layer over the first and second RF electrodes, forming a layer of sacrificial material over the first dielectric layer, forming anchor vias in the layer of sacrificial material, and depositing a thinner layer of metal over the sacrificial material including within the anchor vias. The method continues with forming a second dielectric layer over the layer of metal, patterning and etching the second dielectric layer to remove the second dielectric layer outside of a center membrane area and a hinge area, and depositing a thicker layer of metal over the thinner layer of metal outside of the center membrane area and the hinge area and over the second dielectric layer in the center membrane area and the hinge area. The method further includes forming a masking layer that covers the thicker layer of metal in a drive member area, performing an etch that removes the thicker layer of metal where exposed by the masking layer, wherein the etch continues after removing the thicker layer of metal to remove the thinner layer of metal except where the second dielectric layer protects the thinner layer of metal in the center membrane area and the hinge area, removing the masking layer, and removing the second dielectric layer, leaving a metal top plate having a drive member of both the thicker layer of metal and the thinner layer of metal, a center membrane having the thinner layer of metal without the overlying thicker layer of metal, and a hinge portion having the thinner layer of metal without the overlying thicker layer of metal.

BRIEF DESCRIPTION OF THE DRAWINGS

FIG. 25 is an optional top view of an actuator element having a middle pull-in electrode;

FIG. 26-27 are top and perspective views of the arrangement of FIG. 25;

FIGS. 28-30 are views like those of FIGS. 25 and 26-27 showing a modified form of the structure of FIGS. 25 and 26-27;

DETAILED DESCRIPTION

An example MEMS electrostatic actuator is described as embodied in an RF MEMS tunable capacitor suitable for mobile phone antenna VSWR tuning and other impedance tuning applications. Antenna size limitations imposed by mobile device miniaturization and variations in effective antenna impedance due to environmental influences (hand repositioning, changes in nearby objects, etc.) cause RF losses due to impedance mismatching known as antenna VSWR detuning. Such detuning is characterized by increasing levels of signal power reflected back to the source instead of being radiated by transmitter (TX) or received by receiver (RX) circuits.

The RF MEMS tunable capacitor embodiment addresses the detuning issue using a digitally controllable capacitor array for dynamically tuning the antenna impedance match. The described device may be fabricated using processes similar to those used in the fabrication of micromirror arrays such as, for example, those contained in Texas Instruments DLP® digital micromirror devices (DMDs).

Figure 1:
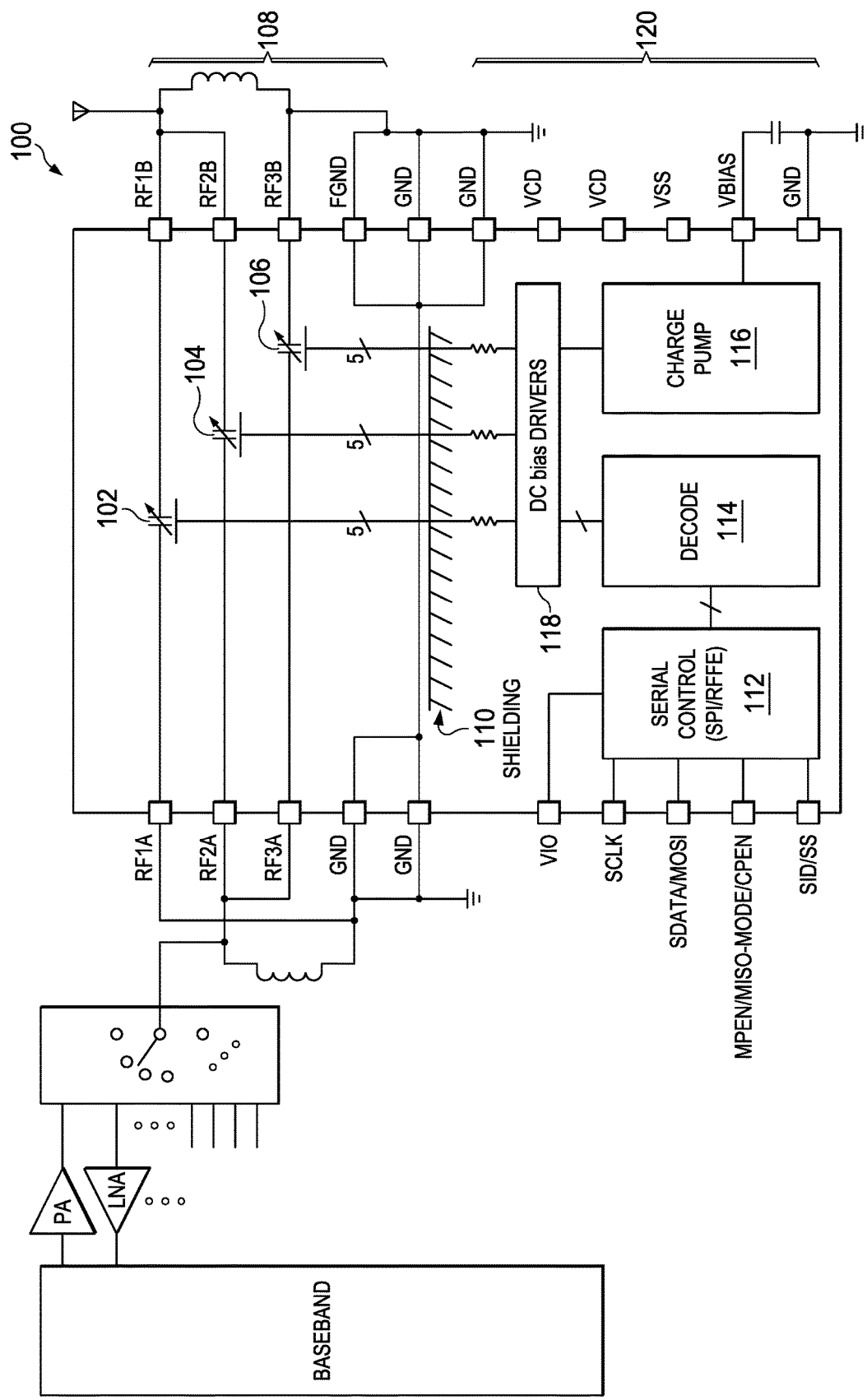
FIG. 1 is a schematic diagram of an RF MEMS varactor device.

FIG. 1 is a circuit block diagram of an example RF MEMS tunable capacitor device 100 connected in a typical antenna tuning application. The example device has three digitally controllable variable series capacitor arrays 102, 104, 106 indicated by three variable capacitor (varactor) symbols formed in a same wafer chip scale package. Each variable capacitor array 102, 104, 106 may, for example, be capable of supporting 1 pF to 6 pF variability in a series configuration and 1.6 pF to 6.6 pF variability in a shunt configuration, with a tuning resolution of 0.16 pF (capacitance step size) for each array. RF signal input terminals (+/−) for each array are indicated by RF1A/RF1B, RF2A/RF2B and RF3A/RF3B, respectively; and RF ground signal input terminals are indicated by GND pins shown above the cross-hatched indication of shielding 110 between the arrays 102, 104, 106 and their drive circuitry 120.

The drive circuitry 120 contains a serial communication interface controller block (Serial Control (SPI/RFFE) 112) for controlling communications to/from the chip, a decoder block (Decoder 114) for decoding data received from the serial interface controller to select which capacitor elements in each array should be set, a charge pump block (Charge Pump 116) for supplying charge to set the selected elements, and a DC bias driver block (DC bias Drivers 118) for applying the charge to execute the selected settings.

The serial interface controller 112 is configured so that it can alternately serve as a MIPI RFFE (MIPI® Alliance Specification RF Front-End Control Interface) slave or as a four-pin SPI (Serial Peripheral Interface) "mode 1" slave, depending on the state of a MODE/OPEN (or MPEN/MISO=MIPI Mode Enable/Master In Slave Out (SPI mode)) pin during power-on initialization. In the MIPI RFFE slave mode, the signal bus consists of a two-wire interface: One serial bidirectional data signal SDATA/MOSI (Serial Data I/O (MIPI)/Master Out Slave In (SPI mode)) line and one clock signal SCLK (Serial Bus Clock) line controlled by an off-chip mobile communications Master RFIC, with the MODE/OPEN pin indicating the MIPI RFFE state (for example, by tying to the VDD pin) and the SID/SS (MIPI Slave Identifier Select/Slave Select (SPI mode)) pin providing a capability for optionally selecting between different slave identification data (SID) values. In the SPI slave mode, the signal bus consists of a four-wire synchronous slave interface (SCLK, MOSI, MISO, SS) that supports 8-bit operations. Data and address/command cycles are 8 bits long. They begin with SS going low and end with SS going high. Once a valid SPI address byte with read/write command is received (on MOSI), the next byte is assumed to be write data (on MOSI) for or read data (on MISO or MODE/OPEN terminal) from the just prior indicated address location (absent a command abort/reset signal communicated on the SS/SCLK lines). In SPI slave mode, the SS slave select line serves for slave selection on a multi-slave bus and the unique slave identification data (SID) value capability is not utilized.

Other pin indications in FIG. 1 are VIO which serves as an input pin to supply power for the serial interface controller, VDD which serves as an input pin to supply power for both the MEMS bias charge pump and other digital circuits, VSS which provides a pin for general ground for the digital circuits and charge pump, VBIAS which provides a MEMS bias voltage pin output for the internal charge pump (shown decoupled with an external capacitor), and GND (or VSSA, bottom right) which provides a voltage (relatively noiseless) reference ground for the charge pump regulator.

Once the device has completed power-on initialization, the varactor arrays are placed in an active mode, with varactor arrays enabled and set to their lowest capacitance settings. In the active mode, the device is ready to receive signal bus commands to dynamically control values of one or more of the arrays.

Figure 2:
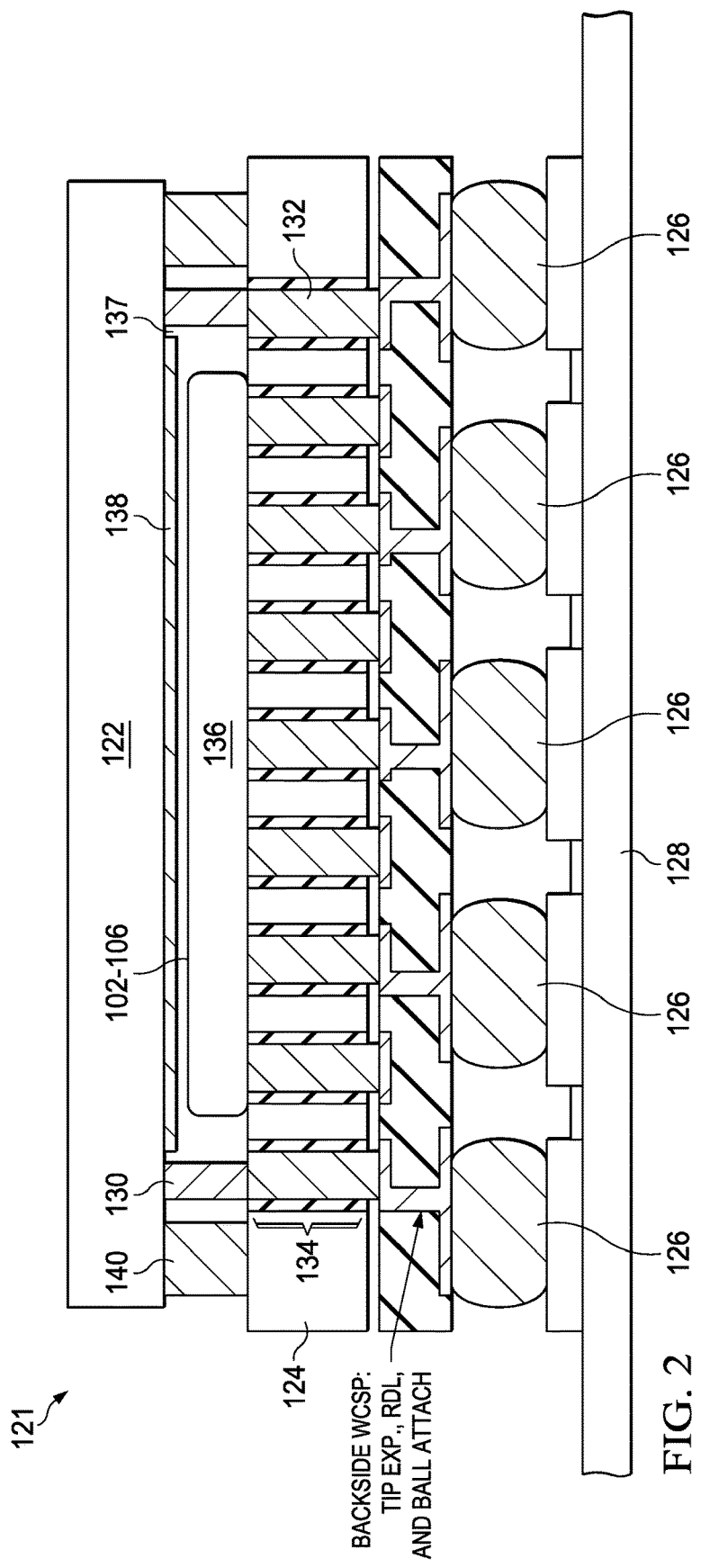
FIG. 2 is as cross-sectional overview of the physical layout of the MEMS electrostatic actuator device.

FIG. 2 shows a cross-sectional overview of the physical layout of the packaged product 121.

Referring to both FIG. 1 and FIG. 2, to isolate the digital electronics from the RF signal portions, the circuitry 120 shown below the cross-hatched shielding in FIG. 1 is formed on one wafer substrate, CMOS Wafer 122, and the varactor array MEMS structures 108 shown above the cross-hatching in FIG. 1 are constructed on a separate wafer substrate, MEMS Wafer 124. The CMOS wafer substrate 122 and the MEMS Wafer substrate 124 each contain the same number of individual dies. The separate wafer substrates 122, 124 are then joined at the wafer level providing a die-to-die hermetical seal and RF-shielded enclosure of each die within the joined wafers for operation of the array MEMS super structure 136. Ball bonds or other suitable connectors 126 are then provided for connecting the joined wafers to corresponding attachment points on a printed circuit board or similar receptacle 128 after singulation. Die-to-die interconnects 130 and through silicon vias (TSVs 132) communicate the digital circuitry 120 of CMOS Wafer 122 and MEMS components 108 of MEMS Wafer 124 with the connectors 126. Separating the MEMS structures 108 from the digital circuitry 120 enables the arrays 102-106 to be built on a high resistivity (e.g., HRS) wafer substrate 124 while allowing the digital circuitry 120 to be fabricated in known ways (for example, using standard CMOS processing steps) on a standard lower resistivity (e.g., TSO) wafer platform. The higher resistivity wafer material provides greater isolation for the RF signal lines and reduces RF signal crosstalk. (This avoids having to thicken the thin dielectric layers used in standard CMOS processing to avoid their behaving like short circuited capacitors vis-à-vis the RF signals.)

The fabrication of the separate MEMS 124 and CMOS 122 wafers may be done simultaneously or at different times according to individual needs and preferences. In one approach the fabrication of the MEMS wafer proceeds first. A BEOL (back-end-of-line) metallization is performed on the MEMS wafer 124 with thin film resistors (TFRs 134) constructed using metal-1 and metal-2 layers. Thereafter, the wafer is subjected to a DRIE drilling process which drills TSV holes into the wafer, the insides of which are then lined with an insulator prior to being plated with copper to form TSVs 132. Next, the wafer goes through the superstructure fabrication process (which may be analogous to a DMD micromirror array fabrication process) for building the MEMS portion components (MEMS superstructure 136) at each die area. The MEMS superstructure 136 is then covered with photoresist which is cured to encase the superstructure in polymer for protection.

The fabrication of the CMOS wafer proceeds next. The serial interface controller, decoder, charge pump, DC bias driver and related circuit components (collectively, digital circuitry 120) may be completed using standard CMOS processing. A metal ground shield 138 (e.g., 3 microns Al ground ring surface deposition) is then applied at each die area in positions corresponding to the locations of the MEMS varactor arrays 102-106/MEMS superstructure 136 of the MEMS wafer 124.

Figure 3:
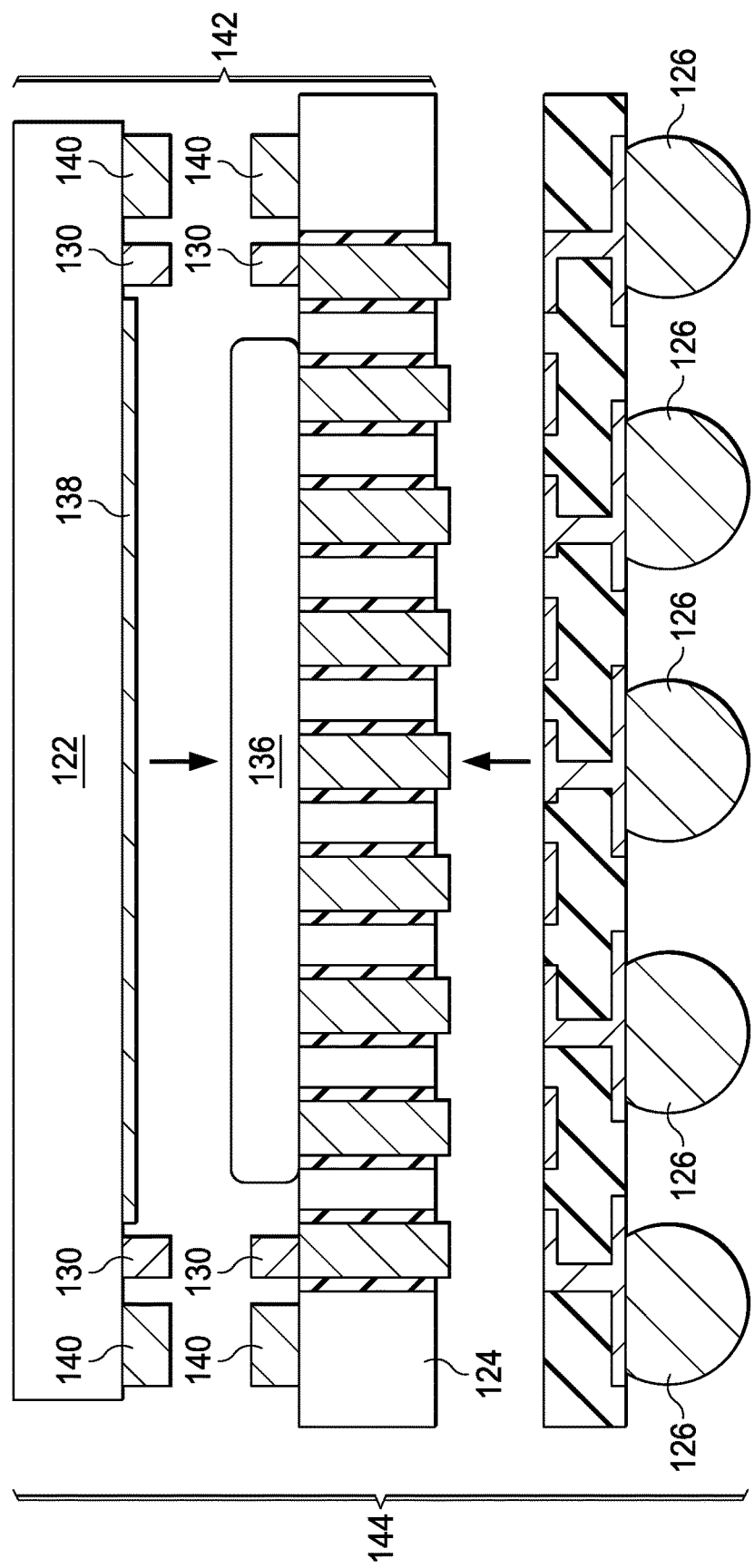
FIG. 3 is a schematic rendition of the described wafer level joining and ball bond attachment procedure.

Portions of the die-to-die interconnect 130 and hermetic bond line structures 140 may then be added to the die on each of the MEMS and CMOS wafers 124, 122, and then brought into bonded contact using a bonding machine and heated to form a composite wafer assembly 142 (see, FIG. 3). The bonded portions provide a hermetically sealed cavity within which the movable elements of the MEMS superstructure are located, with facing surfaces of the MEMS and CMOS wafers spaced apart to provide a headroom (air gap 137) for those elements. The polymer covering that encases the superstructure and the sacrificial layers are removed from the MEMS wafer prior to or at the time of bonding, in order to release the movable elements for operation. The CMOS wafer 122 is bonded to the MEMS wafer 124 in an inverted orientation, with the CMOS processed surface flipped and facing the MEMS structure 136. The CMOS wafer metal ground shield 138 in the joined assembly 142 corresponds to the cross-hatched shielding shown in FIG. 1, and has an area that covers the whole of the arrays in the facing MEMS superstructure 136. In combination with the metal bonding ring 140, the metal ground shield 138 serves as part of a Faraday cage-like structure which surrounds and isolates the RF signals traversing the MEMS components from more lossy portions of the comprehensive structure. This cage can also be used as a critical portion of the RF performance of the device. Through careful design of the separation between the MEMS array and the surrounding grounded metals an image current can be produced which improves the RF performance of the MEMS array.

After the joining of the two wafers 122, 124, the composite wafer assembly 142 is subjected to backgrinding. The top (exposed, non-circuit surface) of the assembly is ground to reduce the thickness of the CMOS wafer 122, and the bottom (exposed, non-MEMS structure surface) of the assembly is ground to reduce the thickness of the MEMS wafer 124 and expose the bottom copper tips of the TSVs 132 which were previously formed only partway through the MEMS wafer. Following completion of backgrinding, a protective coating may be applied over the ground surfaces. The assembly 142 may also be put through a dry silicon etch which selectively etches substrate material (e.g., 5 microns Si) relative to TSV copper to leave (viz., 5 micron) posts or nubs of copper exposed at the via bottom tips. Once the bottom tips of the TSVs 132 have been exposed, further isolation layers are applied, and the assembly goes through an RDL (redistribution layer) copper plating step, another plating step for UBM (under bump layer material) metallization, and then to a ball attach step to form the wafer level package assembly 144.

Figure 4:
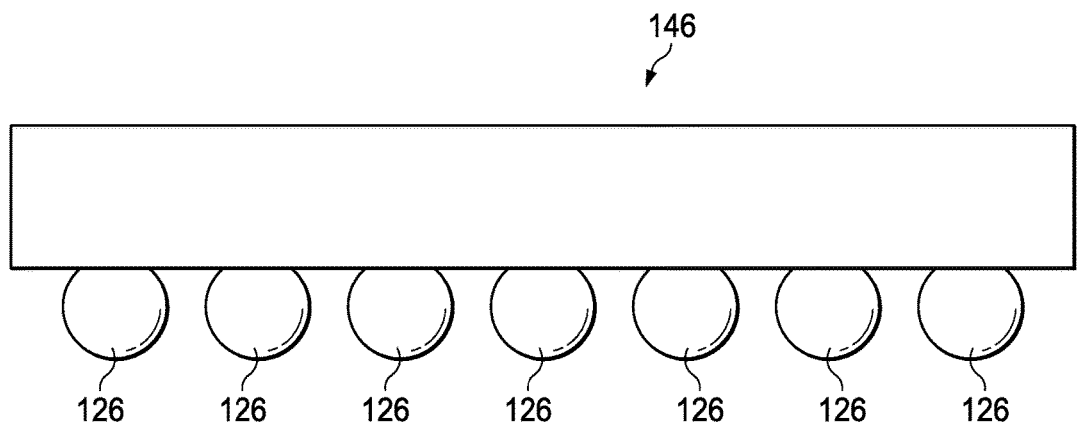
FIG. 4 is a side view profile of a singulated MEMS electrostatic actuator device.

Once the wafer level packaging process is complete, the wafer level package assembly 144 is singulated into discrete RF tunable varactor device packages 146. FIG. 3 is a schematic rendition of the described wafer level joining and ball bond attachment procedure. FIG. 4 illustrates a side view profile of the singulated device 146.

Figure 5:
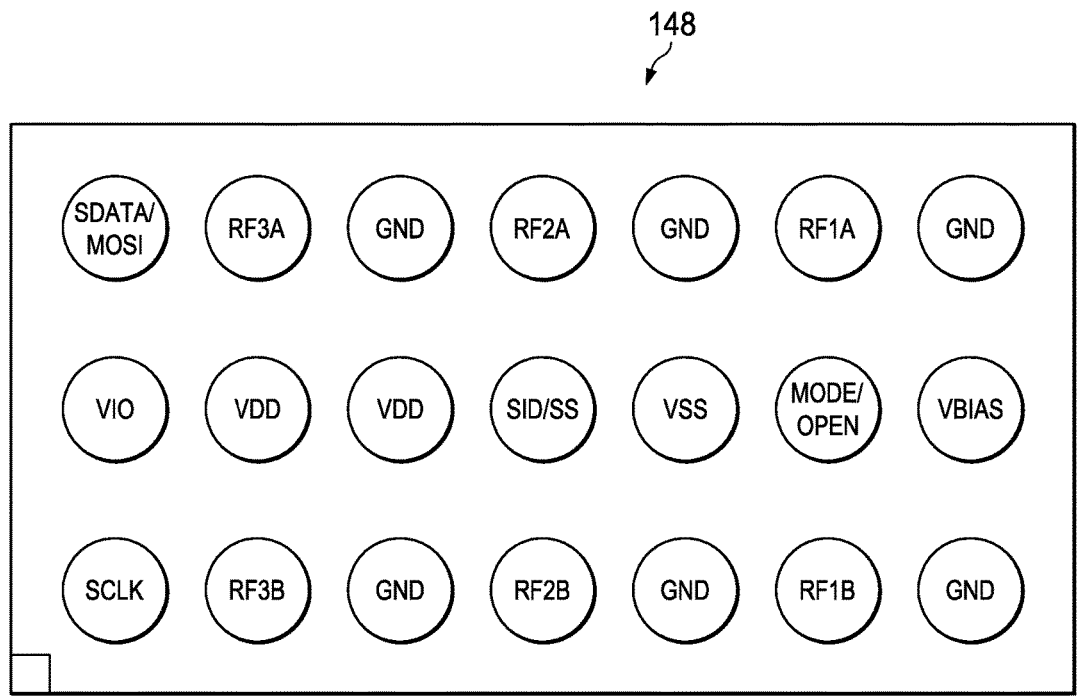
FIG. 5 is a top view of one routing arrangement for achieving separation to reduce cross-talk between RF signals for the pins shown in FIG. 1.
Figure 6:
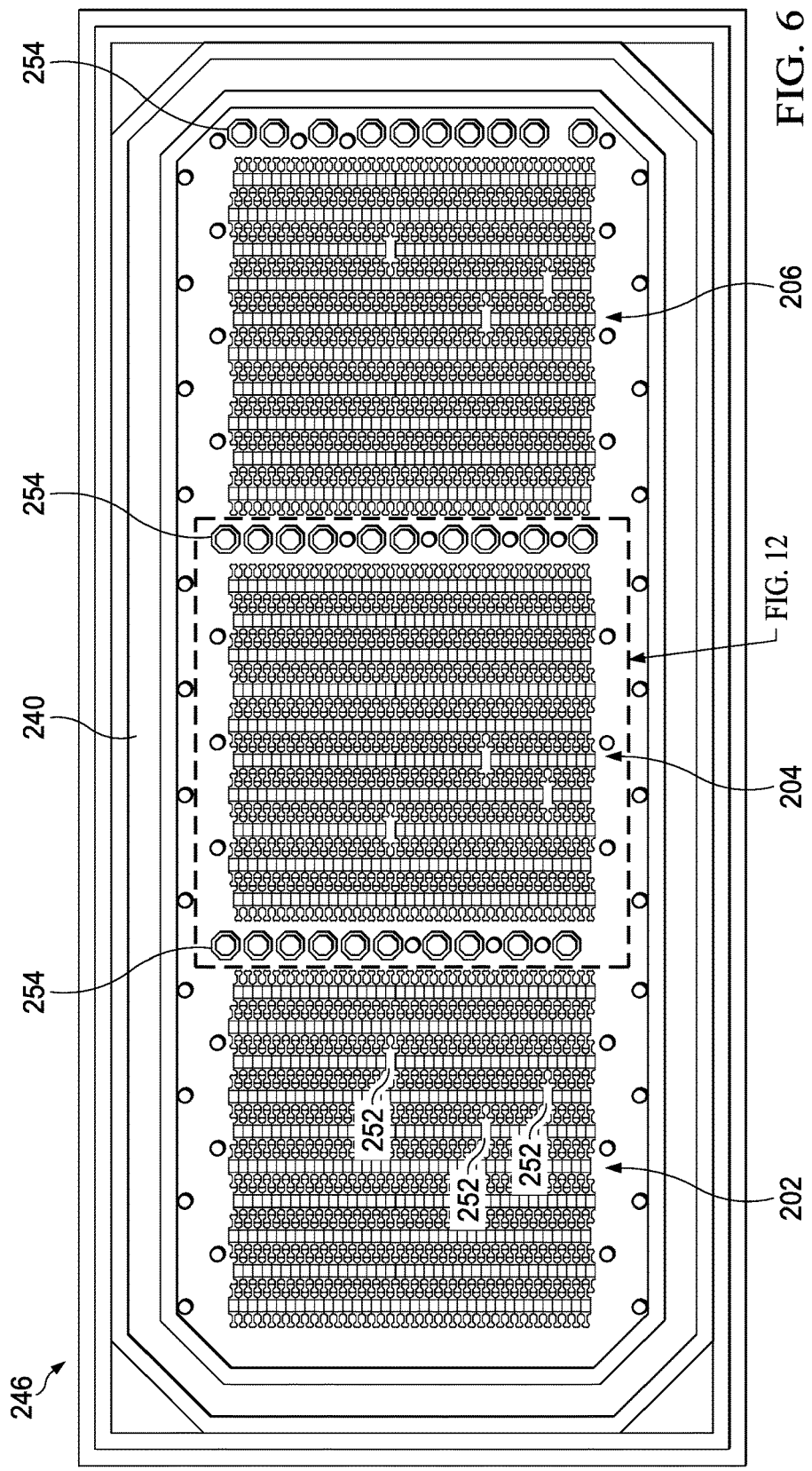
FIG. 6 is a top view of a RF tunable varactor device, looking down on the MEMS wafer portion with the CMOS wafer portion removed.
Figure 7A:
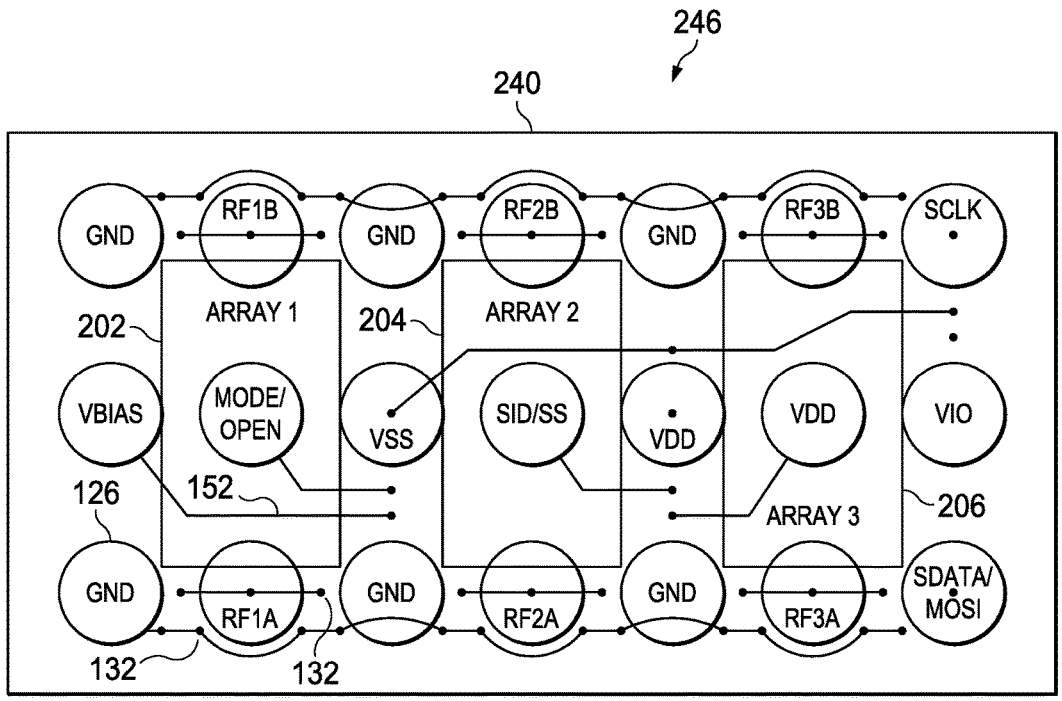
FIGS. 7A-7B are schematic views of the signal routing through the device of FIG. 6.
Figure 7B:
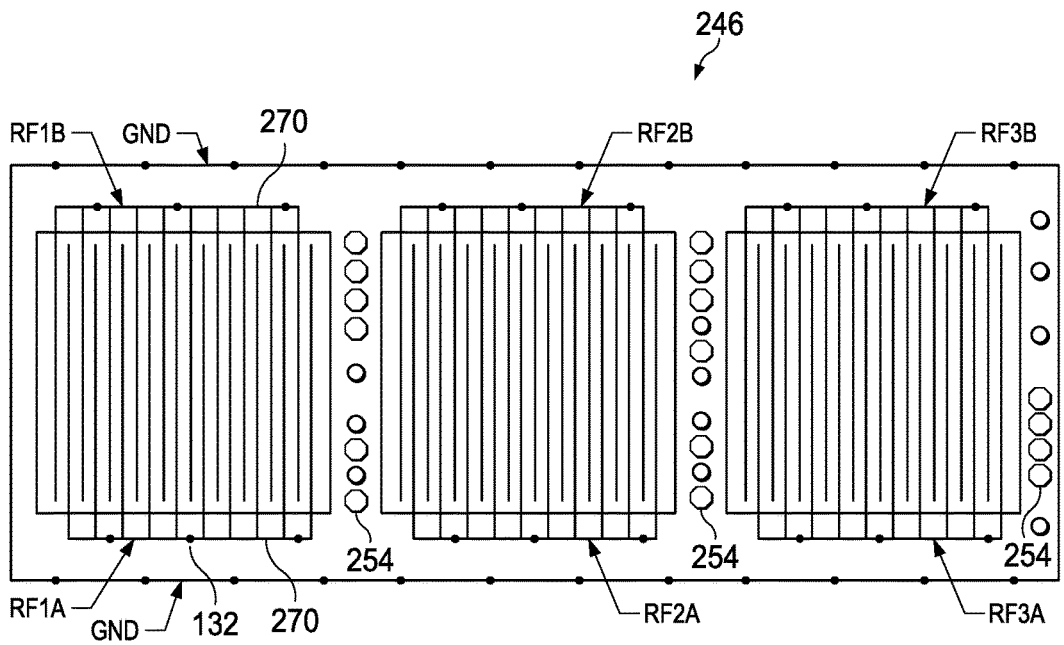

The pin out routings (correspondence between ball bond 126 locations and device pin assignments) may be accomplished according to individual needs and preferences. FIG. 5 illustrates one routing arrangement 148 for achieving separation to reduce cross-talk between RF signals for the 21 pins shown in FIG. 1. The solder balls are arranged in three rows of seven balls each. All RF terminals are positioned on the outside (first and third) rows, with RF terminals AB of the same array separated by one (the inside second) row, with adjacent RF terminals (RF1, RF2, RF3) of different arrays on the same row separated by one ground terminal, and with the RF terminals (RF1, RF2) of the first and second arrays (see FIG. 1) each flanked by ground terminals on either side. The TSVs are configured so that the TSVs for the RF signal lines (RF1, RF2, RF3) come through the MEMS wafer from the respective ball bonds into direct connection with the corresponding RF signal lines, and the TSVs for the ground connections come through the MEMS wafer into direct connection with overlying locations on the ground ring. Accordingly, an RF return path is provided from the CMOS wafer 122 through ground ring 140, a ground TSV in MEMs wafer 124, to the GND ball bonds. The interior bumps (SID/SS and MODE/OPEN) are digital signal terminals surrounded by ground terminals FIG. 6 is a top view of a RF tunable varactor device 246, looking down on the MEMS wafer portion with the CMOS wafer portion removed. FIGS. 7A-7B are schematic views of the same device 246. FIG. 7A is marked to show the locations of the balls 126, the TSVs 132, and RDL routings 152 from the TSVs 132 to the balls 126. FIG. 7B illustrates the RF routing from the TSVs 132 into the arrays.

Figure 8:
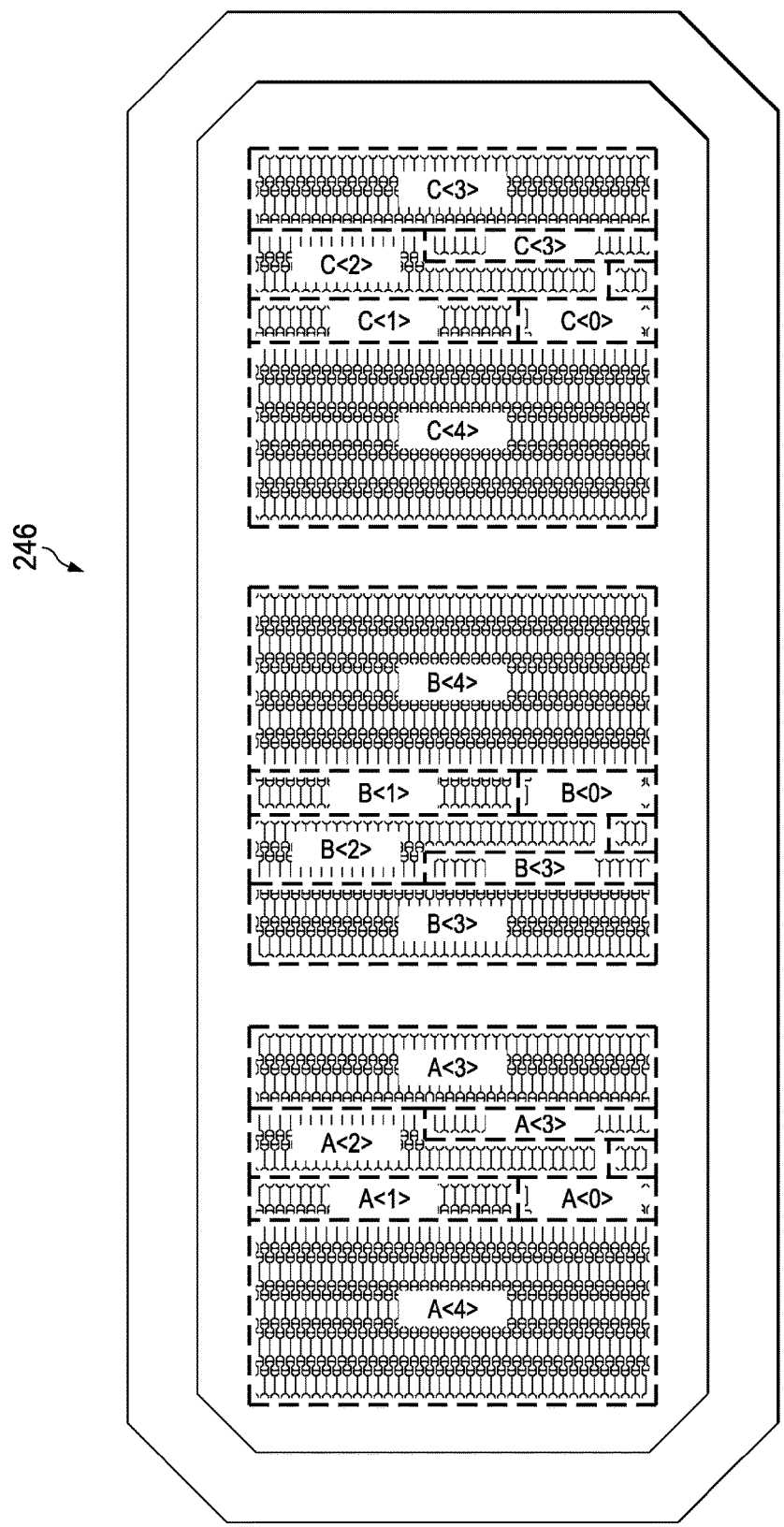
FIG. 8 is a top view illustrating the bitweight allocation arrangement for array addressing.

FIG. 6 illustrates an example architecture having three varactor arrays 202, 204, 206 arranged in a 3×1 side-by-side single row configuration, completely surrounded peripherally by a continuous metal bond ring 240. Each example array has 372 active MEMS electrostatic actuator (varactor) elements (cells) arranged in 10 staggered columns of 37/38 elements each. Each array also includes three depopulated actuator elements 252 locations which serve as breaks for capacitance addressing. The example arrays are addressable for actuator element up/down positioning using 5 bits per array, with a least significant bit (LSB) size of 12 elements. An example 5-bit bitweight allocation (A<0> to A<4>, B<0> to B<4>, C<0> to C<4>) arrangement for array addressing is shown in FIG. 8. Each array provides a tuning capability of Cmin~=1 pF to Cmax~=6 pF, dynamically programmable in 0.16 pF steps and addressable through the MIPI-RFFE/SPI interface.

The arrays are separated laterally by unpopulated regions to provide a shelf (of, e.g., 24 microns width) to allow resist to smooth out over the (e.g., M4) metal layer edge during fabrication and to provide space for posts 254 to establish die-to-die electrical interconnections between the CMOS circuitry (e.g., AFE) and the MEMS components.

Figure 9:
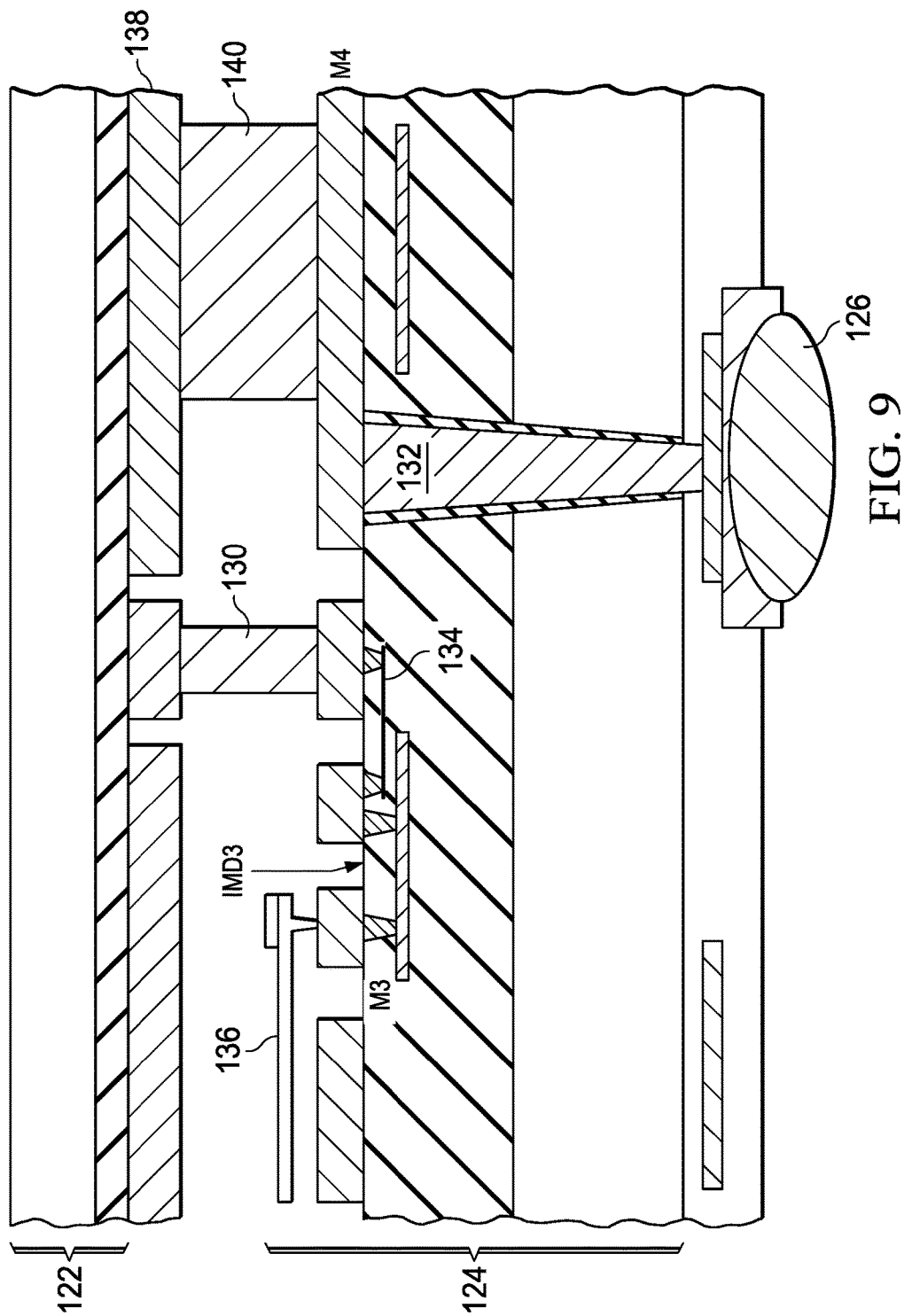
FIG. 9 is a vertical cross-sectional illustration of the joined CMOS and MEMs wafers showing an example ground connection from a ball bump through a TSV to the M4 metal level of the MEMs wafer, metal bond ring 140, and CMOS wafer ground shield components of the Faraday cage-like structure directly over the MEMS superstructure.

FIG. 9 is a vertical cross-sectional illustration of the joined CMOS and MEMs wafers showing an example ground connection from a ball bump 136 through one of the TSVs 132 to M4 metal level of the MEMs wafer 124, metal bond ring 140, and CMOS wafer ground shield components 138 of the Faraday cage-like structure directly over the MEMS superstructure 136 and underlying signal line/electrodes. FIG. 9 also shows an example metal post 130 constructed for communicating actuator element setting signals from the CMOS circuitry in the CMOS wafer 122 to the actuator elements of the MEMs superstructure 136. A SiCr back-end-of-line (BEOL) thin film resistor 134 is shown formed in the intermetal dielectric (IMD3) between the third and fourth metal layers M3 and M4. Representative dimensions are given for the purpose of showing relative thicknesses.

Figure 10:
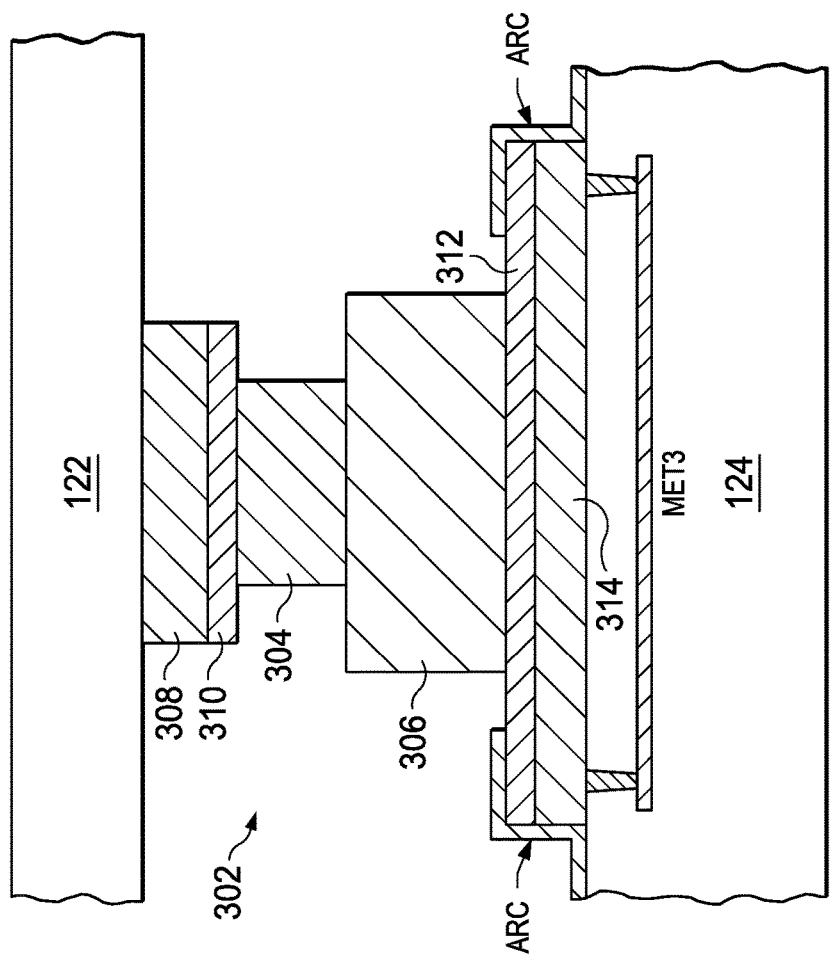
FIG. 10 is a vertical cross-sectional view of an example of a wafer to wafer bonded pillar.
Figure 11:
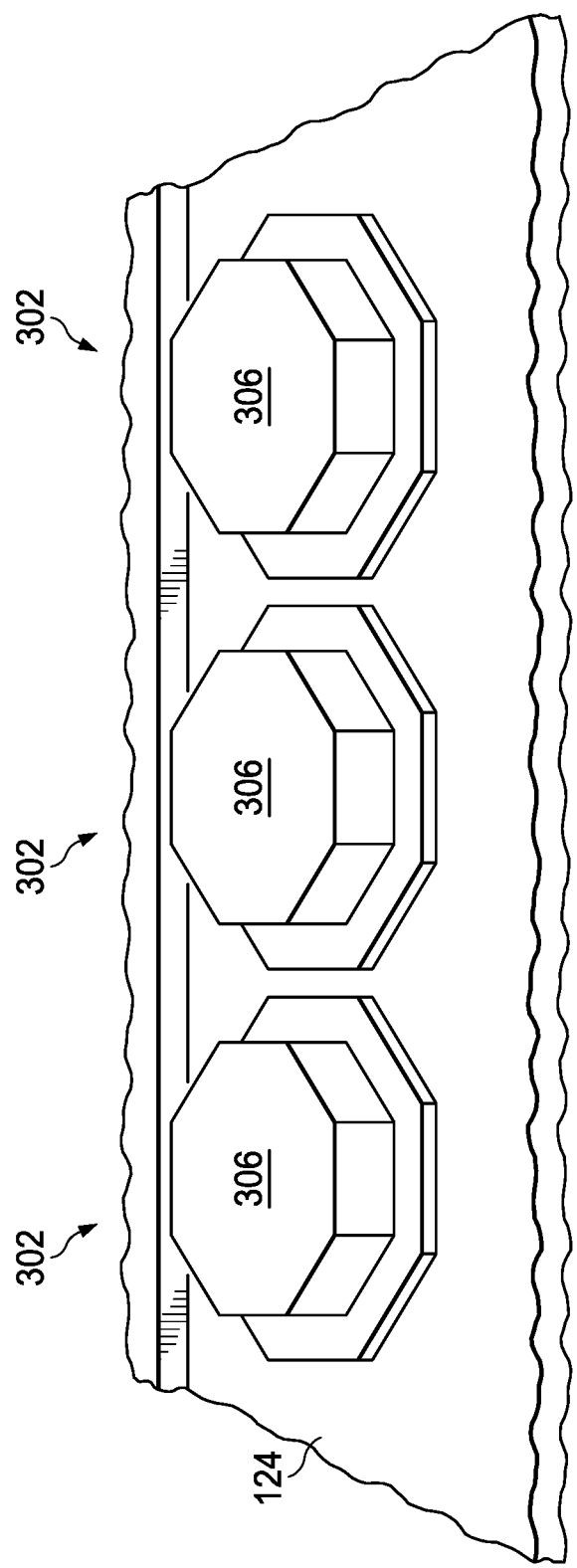
FIG. 11 is a perspective view showing the metal stack portions on the MEMS wafer of a plurality of die-to-die interconnect pillars prior to joining with the top portions on the CMOS wafer.

FIG. 10 is a vertical cross-sectional view of an example of a wafer to wafer bonded pillar 302 used for die-to-die communications such as die-to-die interconnect 130 of FIG. 2. Pillar 302 has a Metal Stack A portion 304 deposited on the CMOS wafer 122 and a Metal Stack B portion 306 deposited on the MEMS wafer 124. Metal Stack A 304 is bonded to Metal Stack B 306. A portion 308 of the metal (e.g., AlCu) for ground shield 138 is formed on the CMOS Wafer 122 in the location of Pillar 302. A layer of TiN 310 is located between portion 308 and Metal Stack A 304. Another layer of TiN 312 is formed on a portion 314 of M4 of MEMs wafer 124. The metal bond ring 140 and the die-to-die interconnect 130 may be constructed similarly and at the same time. FIG. 11 is a perspective view showing the Metal Stack B portions 306 on the MEMS wafer 124 of a plurality of die-to-die interconnect pillars 302 prior to joining with the top portions on the CMOS wafer. Each layer is configured with a general octagonal shape in horizontal cross-section achieved through lithography processes.

Figure 12:
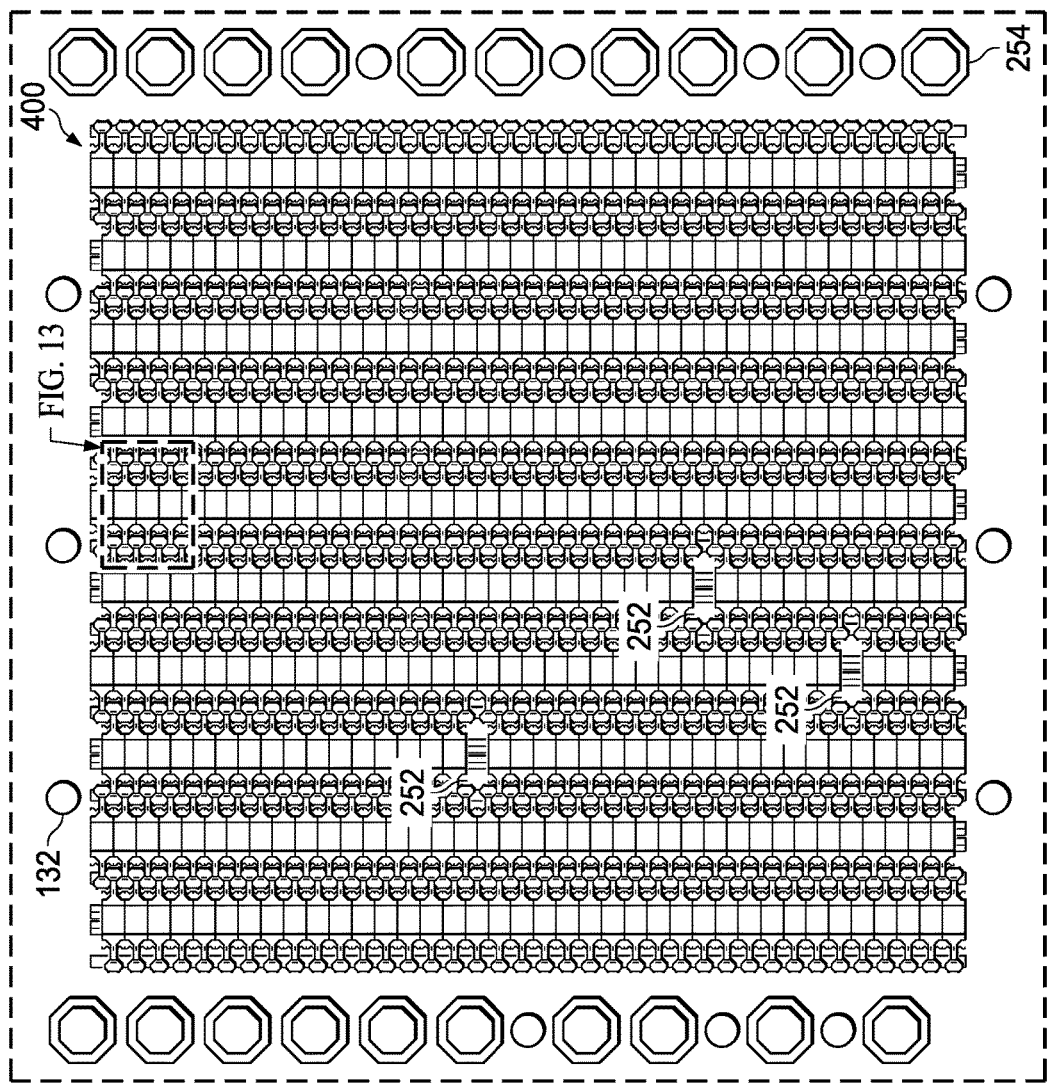
FIG. 12 is an enlarged top view of one of the arrays of FIG. 6.
Figure 13:
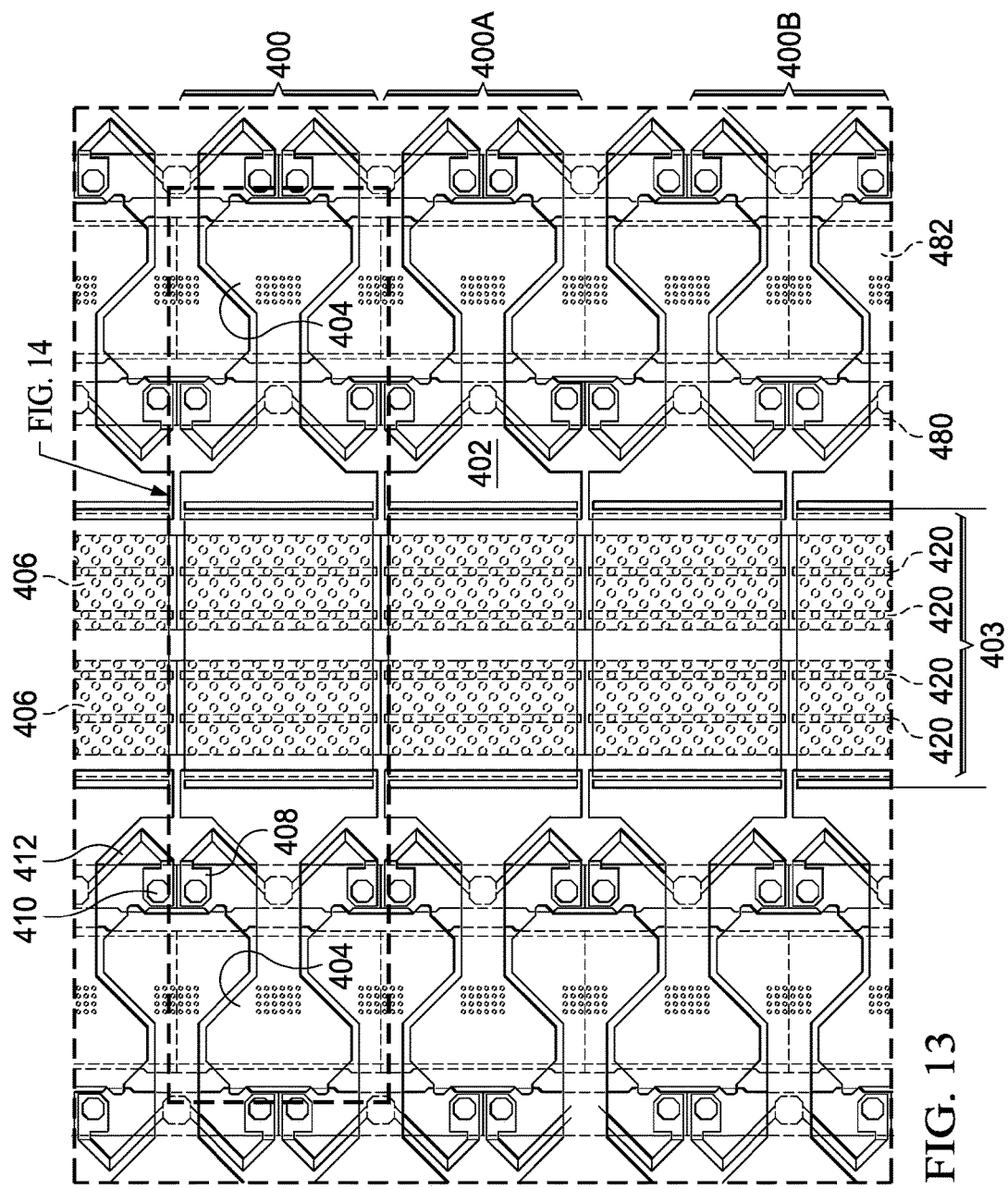
FIG. 13 is a further enlarged top view showing the staggering of actuator elements in adjacent columns of the array of FIG. 12.
Figure 14:
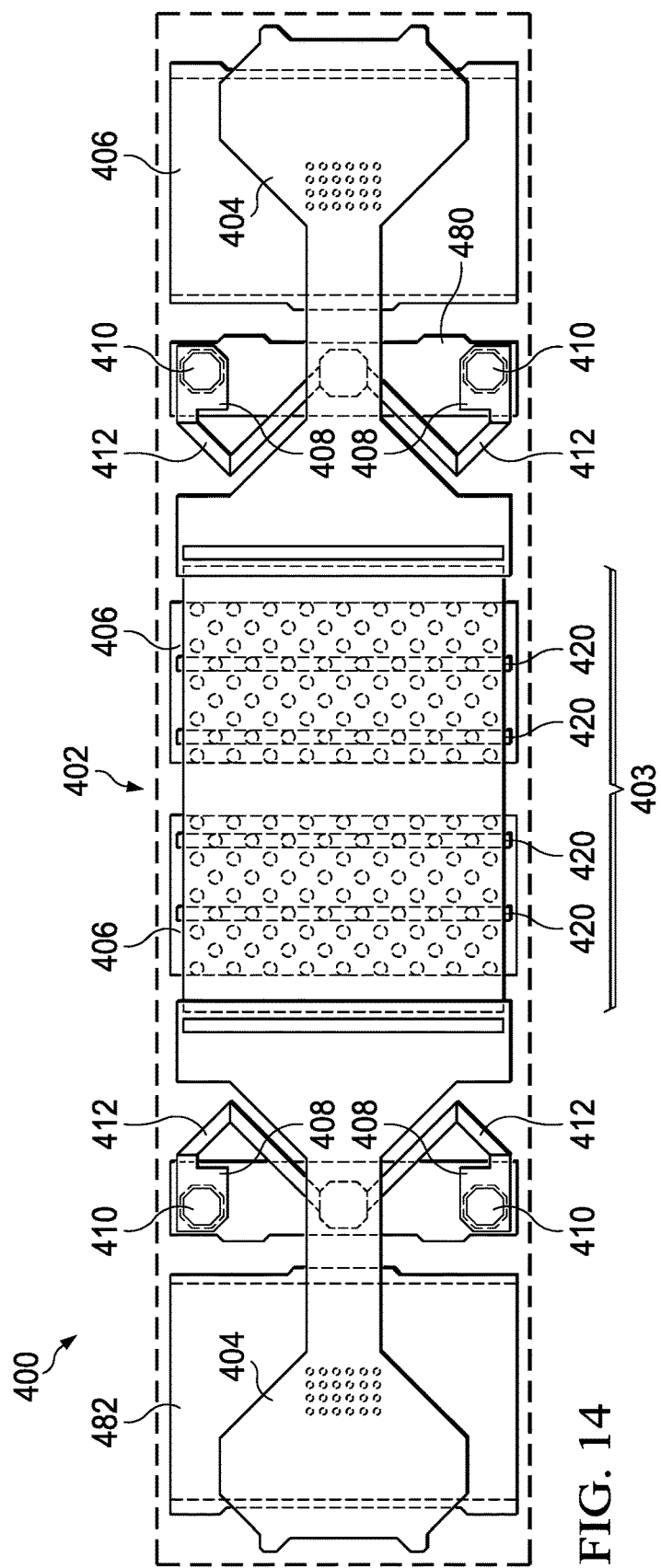
FIG. 14 is a still further enlarged top view showing one of the actuator elements of FIG. 13.

FIGS. 12-14 illustrate further details of the device shown in FIG. 6. FIG. 12 is an enlarged top view of one of the arrays of FIG. 6; FIG. 13 is a further enlarged top view showing the staggering of actuator elements in adjacent columns of the array of FIG. 12; and FIG. 14 is a still further enlarged top view showing one of the actuator elements of FIG. 13.

Each actuator element 400 comprises a metal superstructure 402 suspended above a set of stationary electrodes 406 (initially using a sacrificial layer during fabrication). The stationary electrode positions are shown in FIGS. 12-14, The element may be fabricated using processes analogous to those used in the fabrication of a micromirror element of a MEMS micromirror array in a digital micromirror device (DUD). The metal superstructure 402 serves as one plate (the top plate) of a capacitor and the set of stationary electrodes 406 serve as another plate (the bottom plate). A thin solid dielectric film is deposited on the surface of the bottom plate to prevent shorting.

The top plate 402 comprises three sections: a flexible metal membrane center section 403, and two rotating paddle-shaped drive members 404 connected at respective opposite ends of the center section. All three sections of the top plate 402 are shorted to each other.

Each drive member 404 has an anchor portion 408 attached to the substrate through a set of anchor posts 410. The anchor portions 408 connect to remaining portions of the drive members 404 through torsion hinge members 412 which provide horizontal axis of rotation about which the drive members 404 can pivot relative to the substrate. The drive members 404 are disposed with their respective axis of rotation parallel to each other and perpendicular to a direction of elongation (direction from one driving member to the other) of the top plate. The actuator elements of adjacent columns of each array are aligned row-wise in alternating up/down staggered positions with their longitudinal axis running left to right as viewed in the drawings.

The drive members 404 are generally flat, horizontally planar members when seen in an actuator element neutral horizontal position. They have a paddle-like appearance when view from above, with enlarged octagon-like heel portions at their outer ends, then tapering inwardly to narrower neck portions at their inner ends, prior to joining with respective opposite ends of the membrane section 403. The narrowing at the neck portions enables close packing of adjacent actuator elements (the staggered arrangement), with heel portions of actuator elements of one column/row aligned with neck portions of actuator elements of a next column/row, and vice versa, in an interdigitated way.

The membrane center section 403 is also a generally flat, horizontal planar member when seen in an actuator element neutral position. It has a generally rectangular central portion of uniform width, with opposite outer ends joining corresponding inner ends of respective ones of the drive members 404.

Spring-like fingers 412, having the same thickness as the membrane section 403, extend outwardly on either side of the drive member inner ends, attaching to respective ones of the anchors 410. These provide support and control for movement of the top plate 402, and serve as cantilever springs for storing energy to release it as a restoring force during operation of the actuator element 400. Although the drive member 404 and membrane sections 403 can be formed integrally in contemporaneous layer deposition and patterning steps, the membrane section 403 is given a lesser thickness, to provide its membrane character and greater flexibility.

In one implementation, the membrane section 403 is formed with ribs 420 which run laterally at spaced intervals, parallel to the drive member section axis of rotation (top to bottom direction in the drawings). The ribs 420 provide rigidity, enabling more controlled modes of flexing and greater resistance against unwanted twisting during operation. The ribs 420 may be formed integrally, contemporaneously with the membrane 403 and drive members 404, and to the same thickness as the drive members 404. The example actuator element embodiment shown in FIGS. 13-14 has four, generally evenly spaced ribs 420.

The membrane 403 and/or drive member sections 404 may also optionally be formed with combs or other vertical features that add stiffness in the lateral direction and function to prevent curling and other undesirable flexion modes. The actuator elements shown in FIGS. 15 and 16 have vertical features in the form of alternating horizontal/vertical thickened elongated and hemispherical segments.

Figure 15:
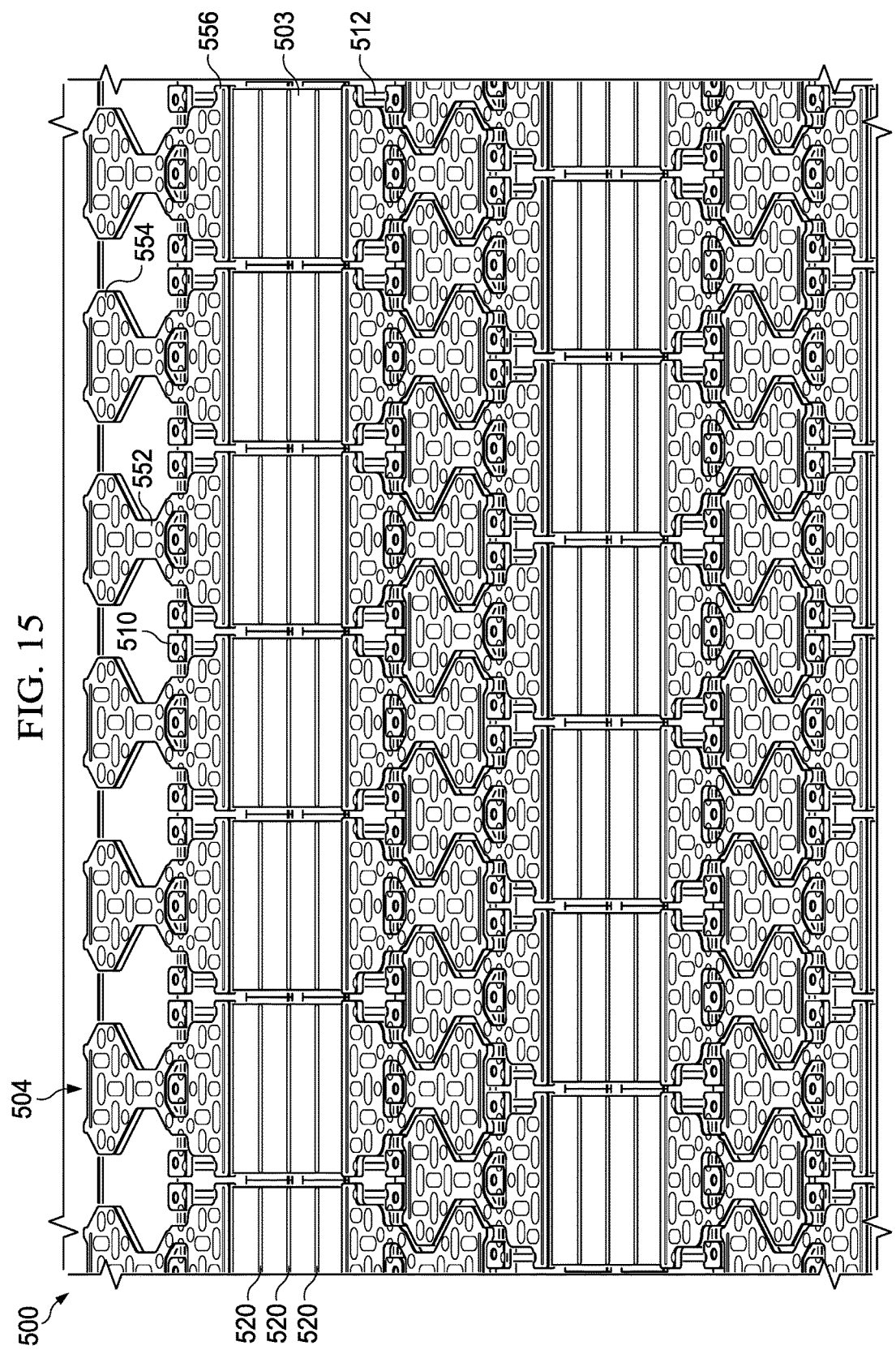
FIGS. 15-16 are enlarged top views of a modification of the actuator element of FIGS. 13-14.
Figure 16:
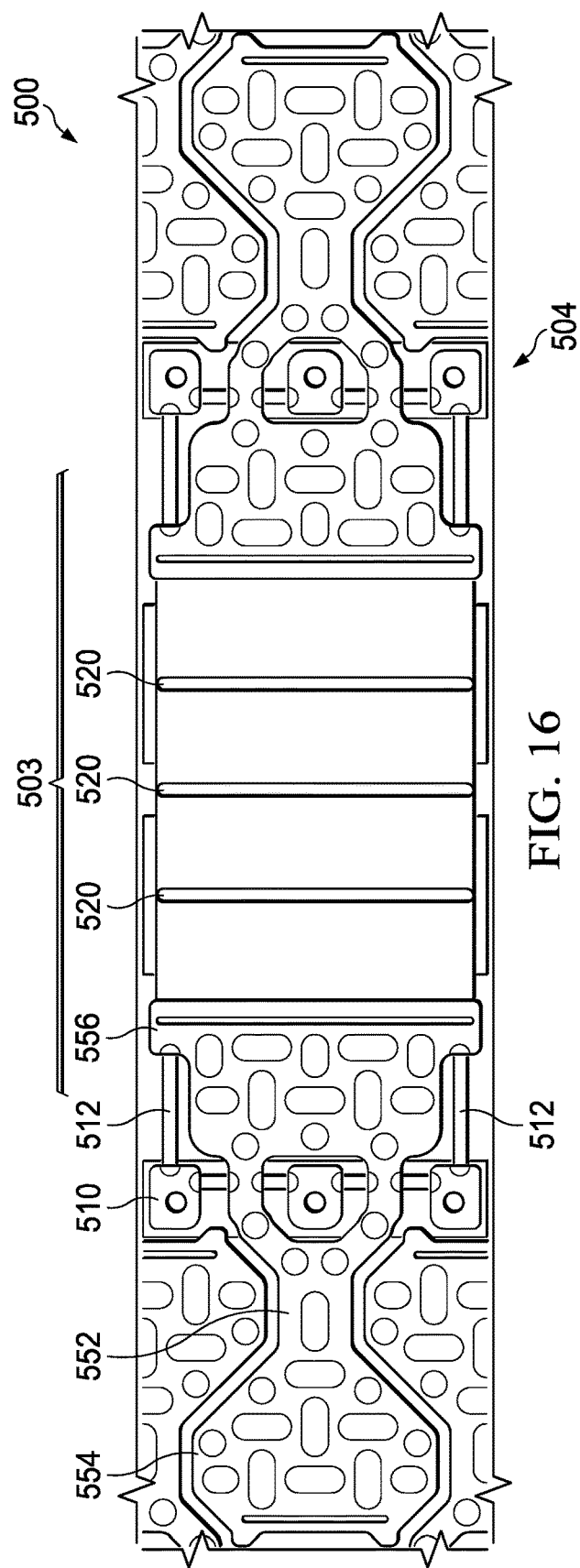
Figure 17:
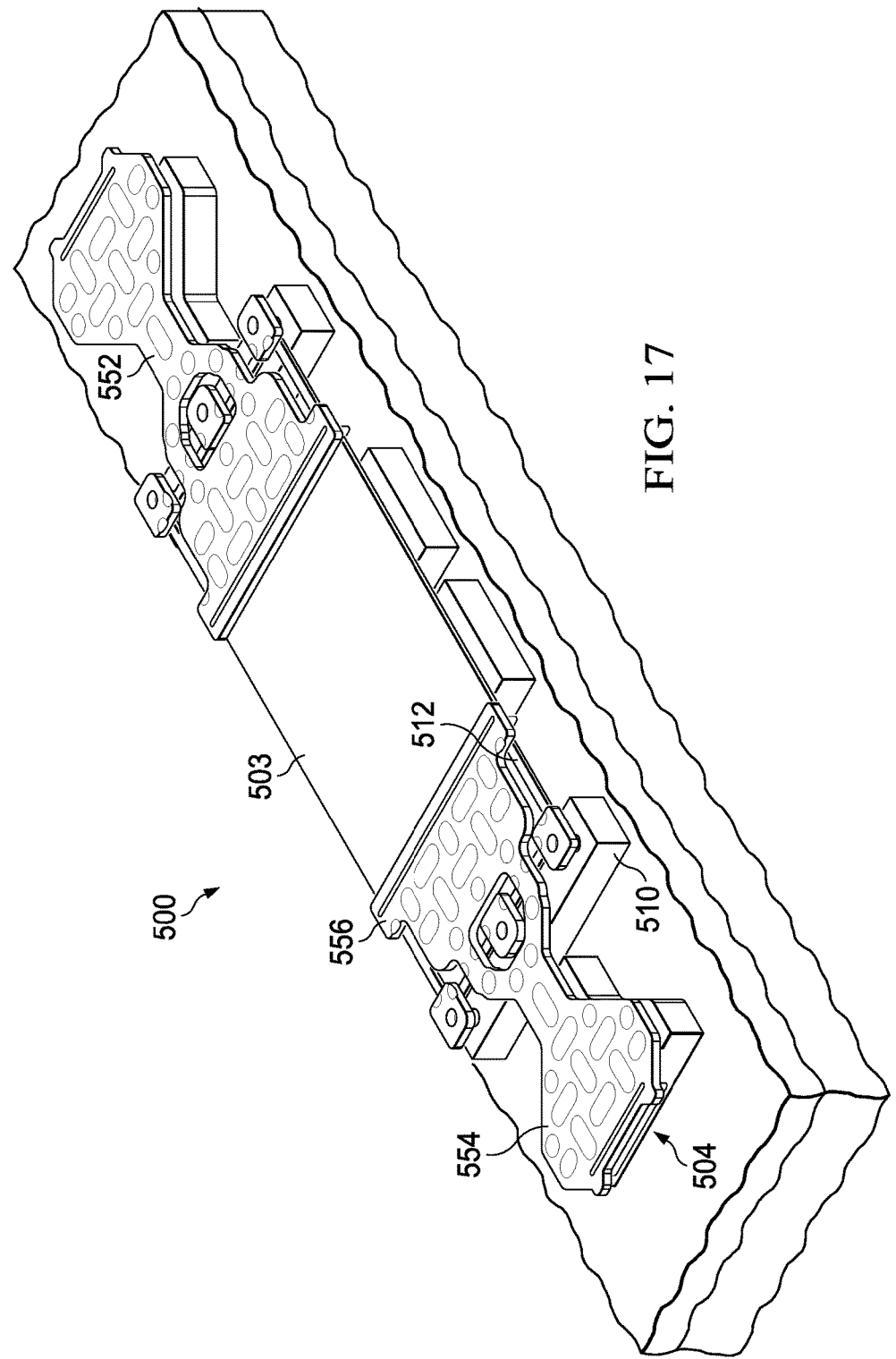
FIGS. 17-19 are perspective, top and side elevation views of the modified actuator element of FIGS. 15-16 without the ribs.
Figure 18:
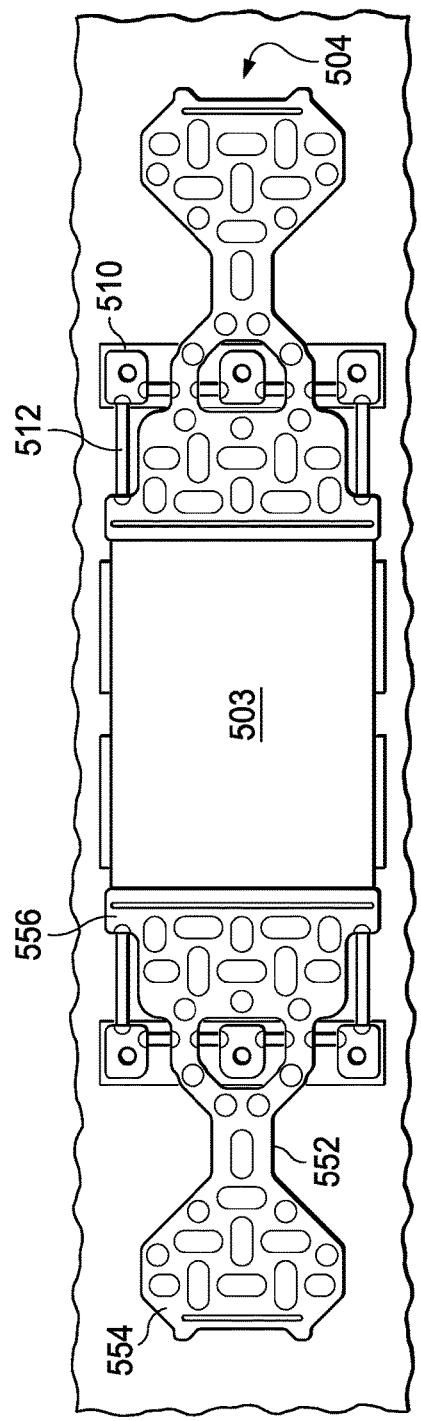
Figure 19:
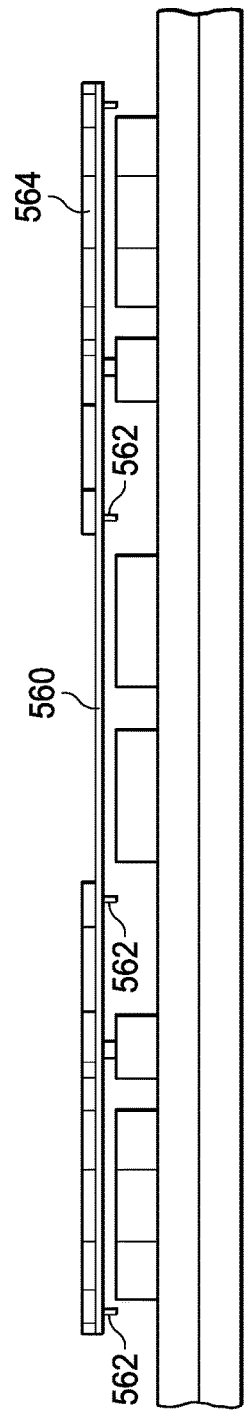

The actuator element 500 of FIGS. 15-16 is a modification of the actuator element 400 of FIGS. 13-14. While the overall configuration is generally the same, there is some difference in configuration of the drive member inner 504a and membrane section outer ends 503a. FIGS. 17-19 are perspective, top and side elevation views of the same modified actuator element 500, shown without the ribs 520. In FIGS. 15-19, the locations of the underlying signal lines/electrodes are not as prominent as in FIGS. 13-14, making their positioning underneath the top plate superstructure more evident.

The drive members 504 in FIGS. 15-19, like those in FIGS. 13-14, are generally flat, horizontally planar members viewed in their neutral horizontal positions, with width variation (variation in dimension parallel to rotational axis) between inner and outer ends. They also taper inwardly to narrower neck portions 552 from enlarged octagon-shaped heel portions 554 at outer ends, enabling the same close-packed interdigitation. The inner ends 556, however, flare out again to join the outer ends of the membrane at their maximum widths, greater than the width of the heel portions. Like the drive members 404 in FIGS. 13-14, the modified drive members 504 are supported on anchor posts 510 which act as torsional supports to enable rotation of the drive members 504 relative to the substrate about the horizontal axis of rotation.

The membrane section 503 of the modification shown in FIGS. 15-19 is also generally flat and horizontally when viewed in a neutral position. It, too, has a generally rectangular central portion of uniform width, with opposite outer ends joined to respective inner ends of the drive members. Spring-like fingers 512 serving as cantilever springs and having the same thickness as the membrane section extend outwardly, longitudinally between corners of the rectangular portion and outside anchor posts. The cantilever springs 512 are generally flat rectangular sections, with a slight outward taper or flare on the horizontal plane provided for stress relief at the point of connection to the anchor post 510.

The actuator element 500 may be fabricated using steps analogous to those used in the fabrication of the MEMS superstructure in a micromirror array. The construction of the superstructure is done after first forming signal lines/electrodes, ground ring, bus and other non-superstructure features on the MEMS substrate (e.g., high resistivity silicon wafer), and deposition of the dielectric material for preventing shorting contact between the superstructure top plates and signal line/electrodes bottom plates of the actuator elements.

A layer of photoresist or similar material is deposited as a layer of sacrificial material and patterned with via openings for providing the anchor posts. The photoresist is hardened with a UV cure and bake. Next, a thin first (membrane) layer of metal material 560 (e.g., 0.12 micron thick 50:50 TiAl alloy; see thin first layer above electrodes in FIG. 19) is deposited over the first sacrificial layer, including within the via openings 562. A layer of oxide material (e.g., 0.14 micron thick silicon dioxide) is then deposited over the metal material 560, and patterned to define parts of the actuator top plate (viz., the membrane) that will not be thickened. A thicker second (stiffener) layer of metal material 564 (e.g., 0.7 micron thick 50:50 TiAl alloy; see second layer above electrodes in FIG. 19) is then deposited over the patterned oxide (hardmask) layer 562. The entire stack of metal materials 560 and 564 and oxide layer 562 is then subjected to selective etching using a patterned photoresist mask. Where the stiffener layer 564 directly overlies the membrane layer 560 with no intervening hardmask oxide, the etch proceeds through both metal material thicknesses down to the sacrificial photoresist. Where, however, hardmask oxide remains between the membrane 560 and stiffener layers 564, only the stiffener layer portion 564 of the metal material is removed, leaving the thinner membrane portion 560 under the oxide hardmask 562 intact. After removal of the etch mask, remaining oxide 562 is stripped away to leave those sections of the top plate which are just membrane metal 560 with no overlying stiffener metal. The sacrificial layer may be left in place as a protection until subsequently removed (viz., by ashing) to release the movable portions at a convenient time prior to enclosing the superstructure within the package. In the described example, the drive members 504 have the thickness of both metal material layers (0.12+0.7=0.82 microns thick) and the membrane portion 503 and cantilever springs 512 have the thickness of just the first metal layer 560 (0.12 microns or 1200 angstroms).

In some implementations, dummy actuator elements or columns of elements may be fabricated at the edges of each array alongside the active actuator elements. This may enable more uniform fabrication of the active elements, by making each active element an interior array element. Additionally, dummy fixed metal structures may be used to influence planarization of the membrane portion.

In the three array implementation illustrated in FIGS. 6 & 7B, signals are fed to the actuator elements from horizontal feed bars 270 at the tops and bottoms of the arrays. Every array has a plurality of first signal lines (RF1B, RF2B, RF3B) which run vertically down from the horizontal bar 270 at the top of the array, column-wise underneath the membrane portions of all actuator elements of the respective different columns. Every array also has a plurality of second signal lines (RF1A, RF2A, RF3A) which run vertically up from a horizontal bar 270 at the bottom of the array, column-wise underneath the membrane portions of all actuator elements in the respective different columns. The RF signals are brought into the package through TSVs 132 within the MEMS wafer from underlying ball bumps 126 (RF1A, RF1B, RF2A, RF2B, RF3A, RF3B) and contact the horizontal feed bars 270 (see FIGS. 5 and 7A-7B). The three arrays are fed by different sets of feed bars and receive their RF signals separately. This enables them to act independently and be connected in different ways.

As shown in FIGS. 6-7B and 12, the RF signal for each feed bar 270 is brought up from the corresponding ball bump 126 through multiple TSVs 132. For the given example, three TSV contacts 132 are provided in parallel spaced positions for each feed bar 270. A purpose of providing multiple contacts is to reduce the inductance associated with the cylinders of copper that make up the TSVs.

The on chip resistors and capacitors located on the MEMS wafer are fabricated with a BEOL SiCr thin film resistor (TFR) process. Resistors are located above and below each array to serve as through contacts for the die-to-die signal buses (see FIG. 9). Ground contacts are placed all around the ground ring 240 which runs peripherally of the arrays. In order to reduce series inductance, the ground vias are placed roughly between two signal vias. Bias voltages and drive out voltages are fed to the arrays in similar ways as the signal lines, the bias voltages 480 being fed to the actuator top plates 402 through the anchor pins 410 (support vias). The bias voltages 480 are fed to the top plates via TFR resistors which have capacitors to ground formed at one end for the purpose of removing AC components from the DC bias signals. These AC shunt capacitors may be formed in BEOL processes by putting square pieces of metal underneath the ground rings.

Figure 20:
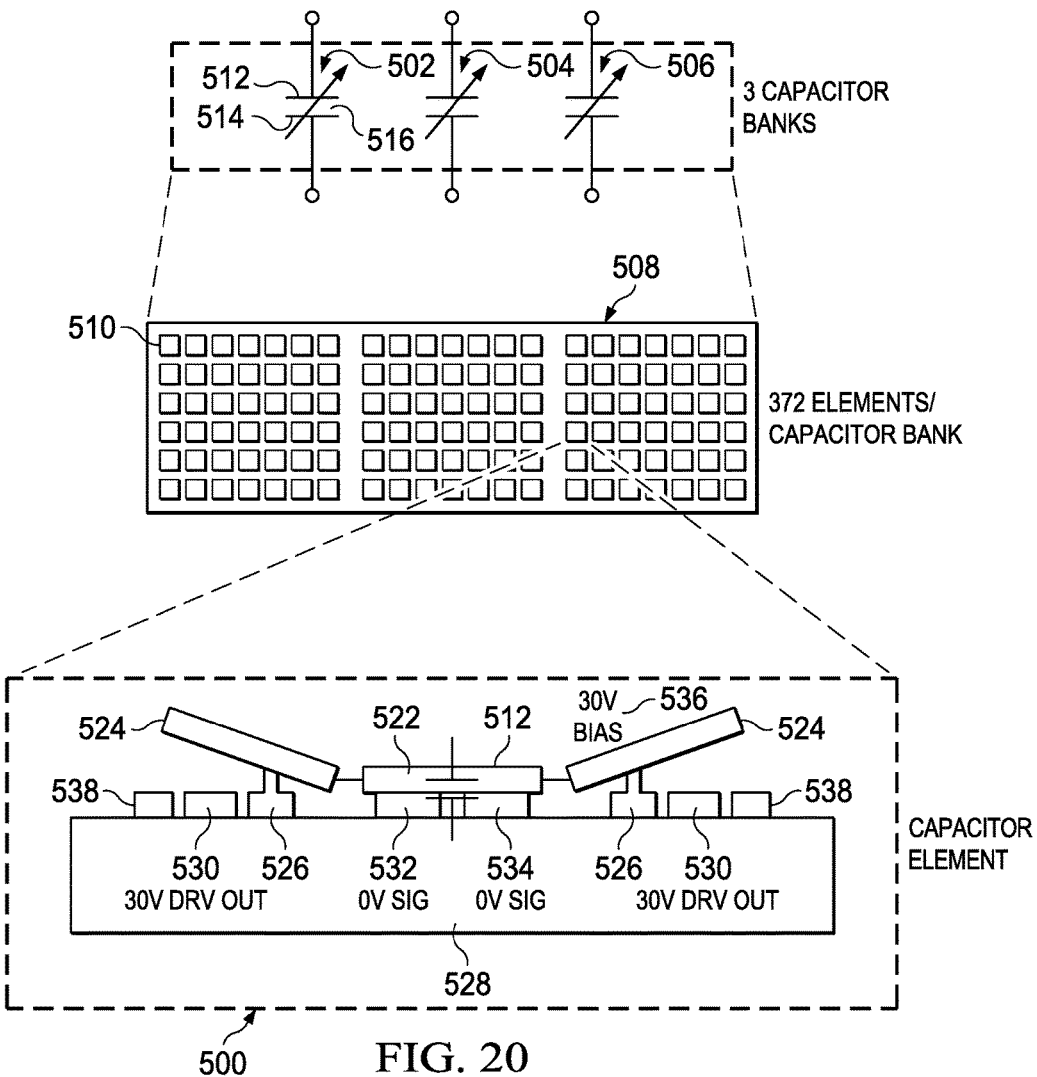
FIGS. 20 and 21 are schematic views illustrating the operation of the actuator elements.
Figure 21:
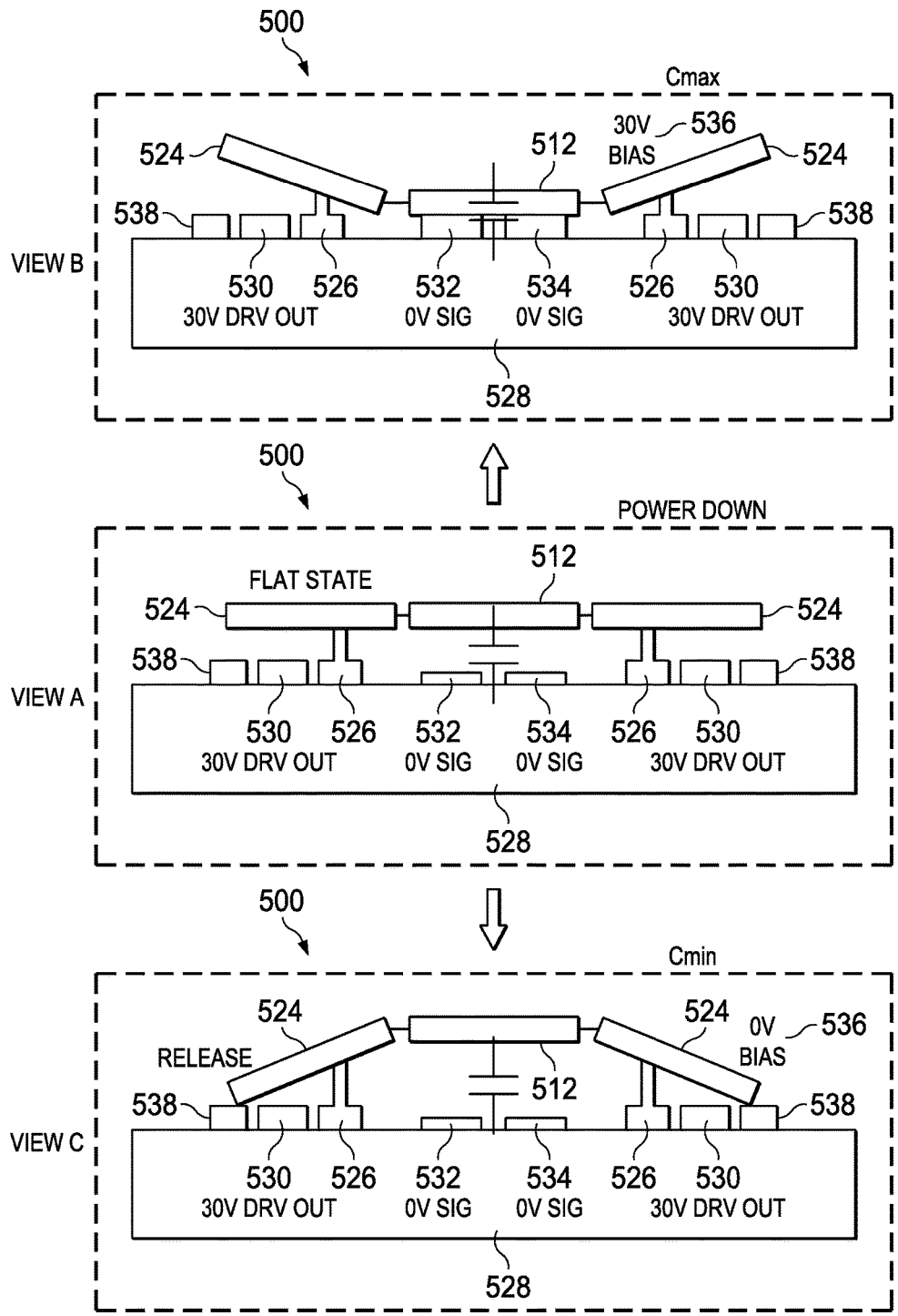

FIGS. 20 and 21 illustrate the operation of the described actuator elements.

Each varactor array 502, 504, 506 in the three array example comprises a dynamically programmable capacitor bank 508 with 372 actuator elements 510 in each array. Each actuator element 510 provides a micro-sized capacitor (micro-capacitor) having a top plate 512 and a bottom plate 514 separated by a dielectric 516, as indicated by the capacitor symbol in the drawings.

The top plate 512 is movable and is constituted by a central membrane portion 522 connected at each end to a respective left or right drive member 524. Each drive member is supported on an anchor pin assembly (pedestal 526) that supports it above the substrate 528 and provides a torsional hinge for enabling rotation of the drive member 524 about a rotational axis perpendicular to the elongation of the top plate 512 (perpendicular to the page as viewed in the drawings). Rotation of the drive members 524 in opposite directions about their respective axis lowers or raises the central membrane 522 toward or away from the substrate. The membrane 522 and drive member 524 sections are shorted together and electrical connection for applying a bias voltage (charge) selectively to the top plate 512 is made through the pedestals 526 (through lines advantageously optionally including the previously described TFR and AC shunt capacitor). Drive-out voltage lines (DRV OUT 530) are optionally run column-wise on the substrate, below the heel ends of the drive members 524. Stops 538 may be applied on the substrate (and/or on the outer edges of the drive members 524) to limit the outward rotational movement of the drivers during the membrane up positioning and preventing contact with the drive-out voltage lines. Increasing the surface area exposed to the drive-out voltage by providing enlarged horizontal plane dimensioned heel sections (as shown in FIGS. 14 and 16) advantageously implements the leverage torque applied by the drive-out voltage during the down-to-up position recovery (assists in preventing lock-up).

The bottom plate 514 is fixed relative to the MEMS wafer substrate and is constituted by the two RF signal lines (RF1A/B, RF2A/B or RF3A/B) 532, 534 assigned to that array. The RF lines (A 532 and B 534) run column-wise in parallel spaced positions, side-by-side below the central section of the top plate 512. The two RF signal lines 532, 534 are coated with a dielectric layer which serves (together with any air gap) as the capacitor dielectric and prevents direct shorting contact with the top plate 512.

Example routings for the bias voltage 536, drive-out voltage 530 and RF signals lines 532, 534 in an array are shown in FIG. 13 as bias voltage line 480, drive-out voltage line 482, and RF signal lines 406. The routings may be formed on the MEMS wafer 124 as M4 metal traces, such as those in FIG. 9.

As seen in the example of FIG. 13, a bias voltage line 480 runs column-wise laterally of each element 400 under the anchor pins 410 of each drive member 404. All actuator elements 400 in the same bitweight group, A<0>, A<1>, A<2>, A<3>, A<4>, B<0>-B<4>, C<0>-C<4> (see FIG. 8) receive the same bias voltage. For example, breaks 252 in the array 202, 204, 206 (see unpopulated actuator spaces shown in FIGS. 6 & 12) can be used to separate bias lines 480 into isolated segments to enable independent addressing of different bitweight group actuator elements sharing the same column (viz., partial column groupings). Bias voltages are applied to the bias voltage lines 480 of each column through busses. The busses receive the bias voltage signals through the CMOS substrate (see FIGS. 1 and 2). The bias voltages are applied to the different bitweight groupings in response to decoded digital actuator position setting data signals received be the serial interface controller from an external source (e.g., off-chip mobile communications Master RFIC).

FIG. 21 View A shows the micro-capacitor actuator element 500 in its power down, neutral horizontal (flat state) position, with RF signal lines 532, 534 at 0V DC and drive-out lines 530 at 30V DC. To set the micro-capacitor to its maximum capacitance (Cmax) value, 30V DC bias voltage 536 is applied to the top plate 512 through the pedestals 526. The DC voltage differential between the top 512 and the bottom plates 514 (532,534) causes the top plate 512 to be attracted toward the bottom plate 514 against the mechanical bias of the cantilever springs, into its down/landed position shown in FIG. 21 View B. To set the micro-capacitor to its minimum capacitance (Cmin) value, 0V DC bias voltage 536 is applied to the top plate 512 through the pedestals 526. This removes the DC voltage differential between the top and bottom plates if previously landed in the down position, releasing the top plate 512 back into the flat state under restoring force applied by energy stored in the cantilever springs. In addition (or, if moving from the flat state and not previously in the down position), the DC voltage differential between the 30V DC drive-out lines 530 and the 0V DC top plate 512 causes the heel portions of the top plate 512 to be attracted down toward the drive-out lines 530, rotating the drive member sections 524 outwardly in opposite directions toward the stops and raising the membrane central section 522 up to bring the top plate into its up/released position shown in FIG. 21 View C. (The 0V and 30V DC voltage values are given for purposes of illustration only. Actual voltages utilized in specific implementations will depend on individual needs and preferences.) In the up/released position of View C, stops 538 may be used to limit the outward rotational movement of the drivers 524 and preventing contact with the drive-out voltage lines.

Figure 22:
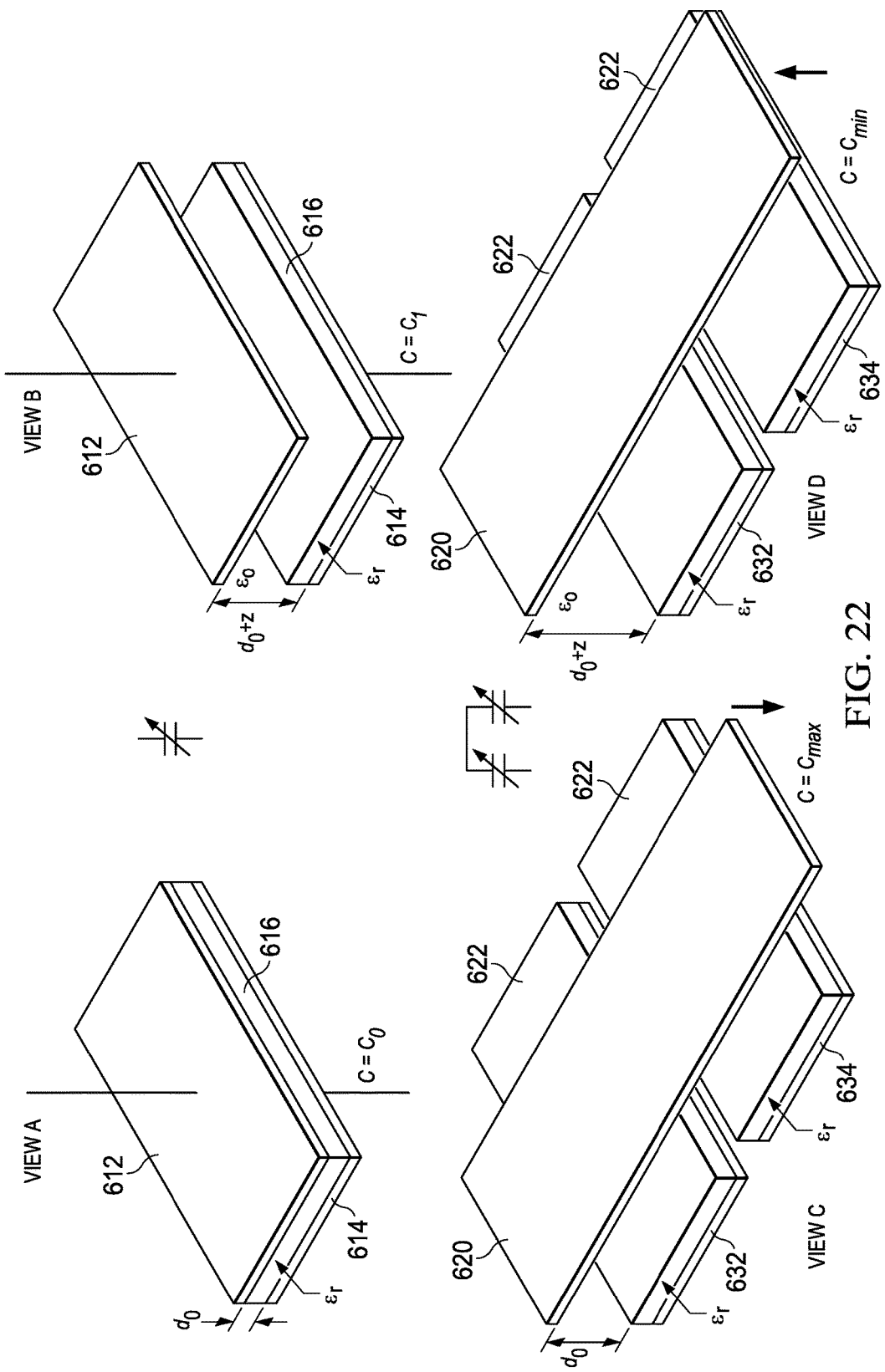
FIG. 22 is a schematic view illustrating the theory of operation for an actuator element.

FIG. 22 illustrates the theory of operation for an actuator element. Capacitance=∈A/d (dielectric constant×plate area/distance between the plates). For an arrangement where the top 612 and bottom 614 plates are in contact with an intervening dielectric 616 of thickness $d_0$ and dielectric constant $\in_r$ (View A), a first state can thus be established having a first capacitance value expressed in terms of $\in_r$, A and $d_0$. If then the top plate 612 is elevated above the intervening dielectric 626 by a gap of dimension z and dielectric constant $\in_0$ (View B), a second state can be established having a second capacitance value expressed in terms of $\in_r$, $\in_0$, A, $d_0$ and z. Applying this to the described varactor device having two RF signal lines 632, 634 forming the bottom plate, it can be seen that a first capacitance value Cmax is established when the top plate 620 (viz., membrane section) is brought down towards the bottom plate (viz., RF signal lines 632, 634) into its landed dielectric layer 622 contact (or close proximity—actual contact not being a requirement) position (View C). A second capacitance value Cmin is established when the top plate 620 (viz., membrane section) is moved away from the bottom plate (viz., RF signal lines 632, 634) into its raised elevated position. Having dual RF signal lines 632, 634 allows for connections and signal lines to be set to place the actuators in series (indicated) or shunt configurations. A series connection is established by leaving RF signal line 632 unconnected from RF signal line 634 and a shunt connection is established by connecting RF signal line 632 to GND.

Using a thin membrane rather than a thicker, more rigid central section (see application Ser. No. 13/614,936) enables the top plate central portion to be drawn down and rolled out smoothly onto the dielectric layer from its center outwardly toward its sides, and to be peeled away from the dielectric layer from its sides inwardly toward its center. Additionally, bumps or other surface irregularities can be optionally added to one or both of the dielectric and membrane layers to assist the roll-on/peel off motions and/or improve the landed contact/lift off characteristics.

Figure 23:
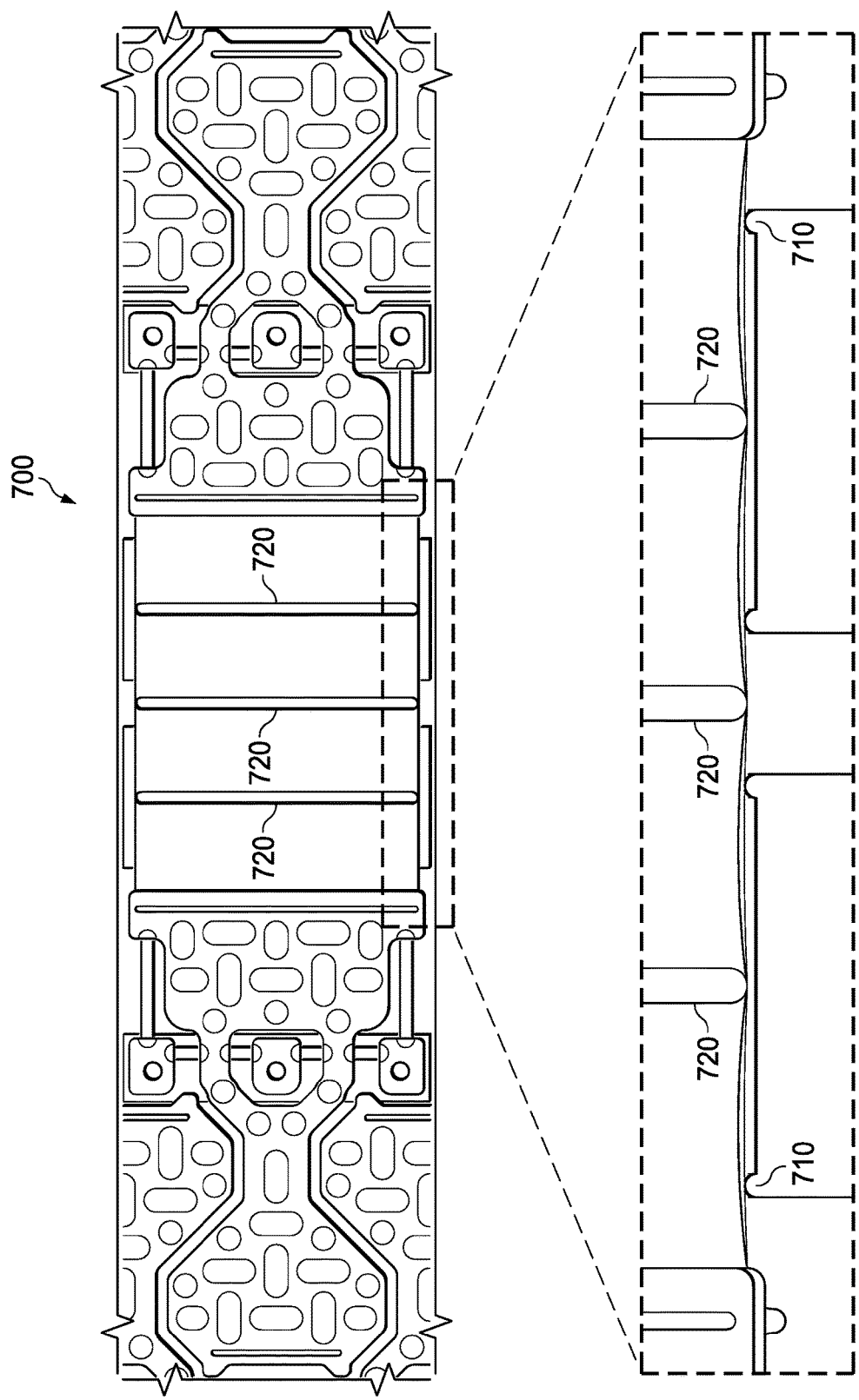
FIG. 23 is a top and side view of an actuator element illustrating the addition of bumps on the upper surface of the dielectric layer covering the tops of the RF signal lines.

FIG. 23 illustrates the addition of bumps 710 on the upper surface of the dielectric layer 712 covering the tops of the RF signal lines 714. Bumps 710 reduce charging and adhesive forces. View A corresponds to the top view of an actuator element 700, similar to that given in FIG. 16. View B shows the bumps 710 formed on the dielectric material 712 above lateral leading and trailing edges of each signal line 714, with the bumps 710 running in the same direction as the membrane rib portions 720. In the illustrated three-rib arrangement, relative positions are optionally established so that one rib 720 of the membrane (thicker than rest of membrane) lands centrally over each RF signal line 714 and one rib 720 lands centrally over the separation spacing between the lines 714. This optional positioning lands the membrane with the lateral edge bumps 710 located under the thin portion of the membrane, either between two ribs (bumps 710 at inner lateral edges of RF lines 714) or between a rib 720 and an inner end of one of the (thicker than membrane) drive members (bumps at outer lateral edges of RF lines 714).

Figure 24:
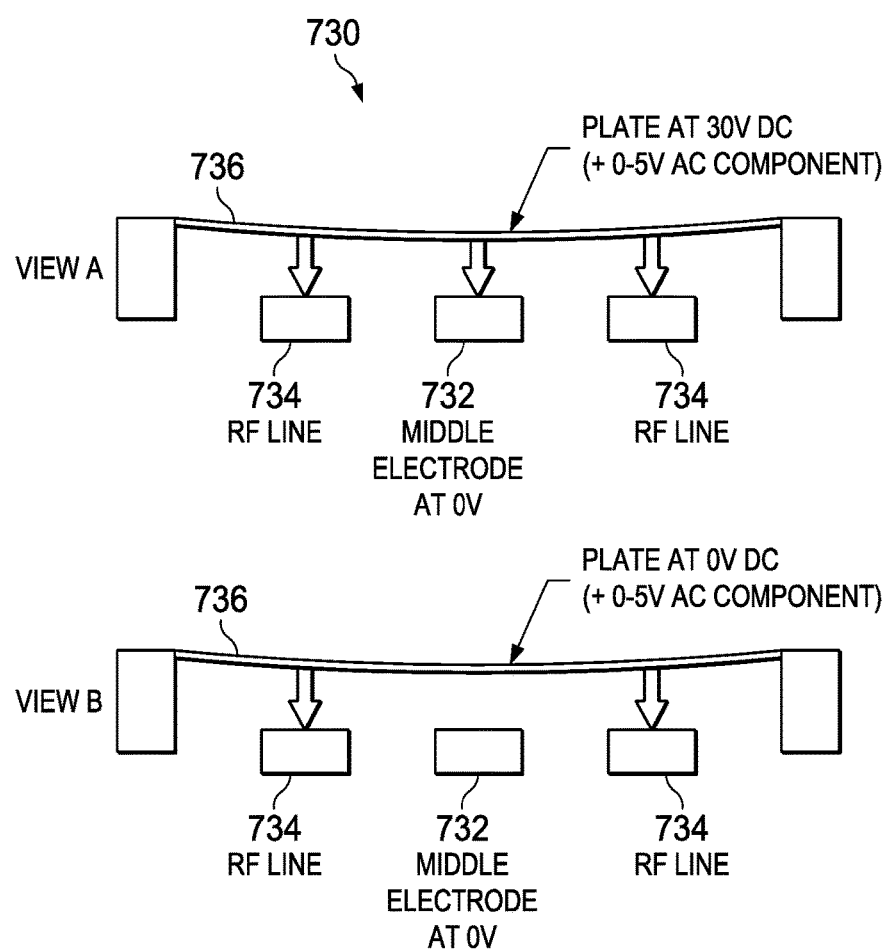
FIG. 24 is a schematic view showing an optional middle/pull-in electrode.

FIG. 24 illustrates an actuator arrangement 730 having a pull-in line 732 (pull-in plate) located as a middle electrode running column-wise between RF lines 734 in a two-RF line bottom plate configuration. Positioning the pull-in line 732 between the RF lines 734 increases the separation between the self-actuation voltage and the designed pull-in voltage (unwanted movement toward the bottom plate in the absence of application the land state bias) in some embodiments, especially those which do not include drive-out electrodes.

In an example operation, the middle electrode 732 and the RF signal lines 734 are maintained at 0V DC (viz., grounded). When the top plate 736 is given a positive DC bias voltage (e.g., 30V DC) for landing, all three electrodes (RF signal lines 734 and middle pull-in line 732 both at 0V DC) act to pull the top plate down 736 (see FIG. 26 View A). This is so, even when variation of the voltage differential due to the RF signal AC component is considered. The effect of the RF signal AC component on the landing force is not significant because the DC equivalence of the RF component is small compared to the much higher 30DC applied bias value. The RF signal may, for example, go up to 50V AC peak-to-peak but, when added to the 30V DC bias value differential, the DC equivalent force effect only goes from 30V to 35V DC (30V DC+0V AC=$30V_{RMS}$; 30V DC+50V AC=$35V_{RMS}$). However, when the top plate bias voltage is brought low (e.g., to 0V DC), there may still be a slight pull-down force exerted by the RF lines 734 due to the 0V to 5V DC equivalence introduced by the RF signal AC component (0V DC+0V AC=$0V_{RMS}$; 0V DC+50V AC=$5V_{RMS}$) (see FIG. 26 View B). Positioning the pull-in electrode 732 centrally between the RF signal lines 734 places the middle of the membrane closer to the pull-in electrode 732 and further from the RF lines 734, thereby reducing the pull-in effect of the RF lines 734 and raising the AC component $V_{RMS}$ self-actuation threshold.

FIG. 25 is a top view illustrating an example actuator element 750 having a pull-in line 752 located as a middle electrode running column-wise between RF lines 754 of a two-RF line bottom plate. The top plate 756 has a generally rectangular, flexible membrane center section 760. The top plate 756 is mounted on torsional hinge anchor structures 762. Cantilever springs 764 in the form of serpentine fingers extend from outer corners of the membrane center section 760 to anchor posts 762 comprising top plate metal filled vias. Bias voltage lines 766 running column-wise under the posts 762 serve to bias the top plate 756 for moving the membrane center section 760 between landed Cmax and elevated Cmin settings. In contrast to the actuator of FIG. 14, the actuator of FIG. 24 has a "hinge-only" top plate 736, meaning that drive members similar to drive members 404 and drive out electrodes 406 are not included (i.e., the top plate 736 does not extend past the anchor structures 762).

Figure 27:
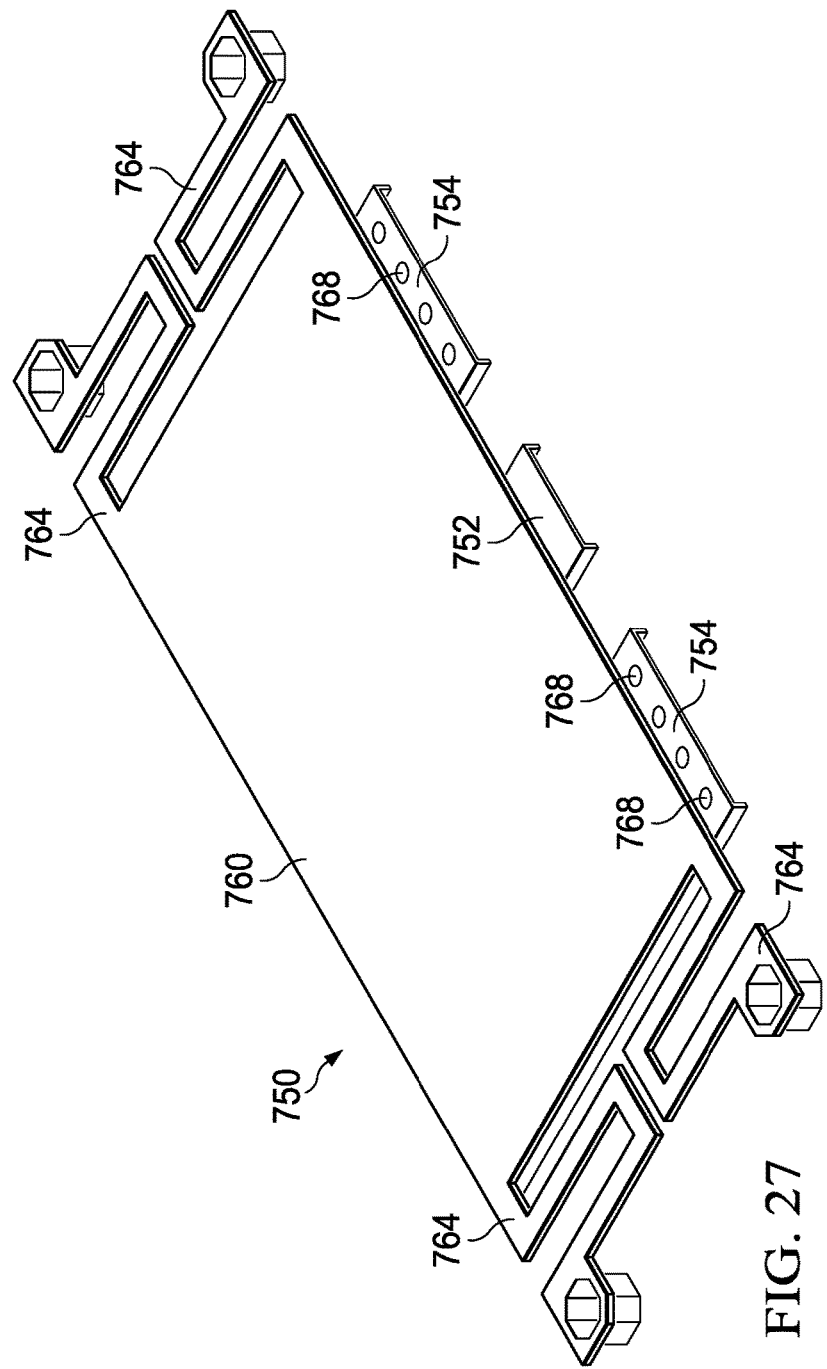
Figure 30:
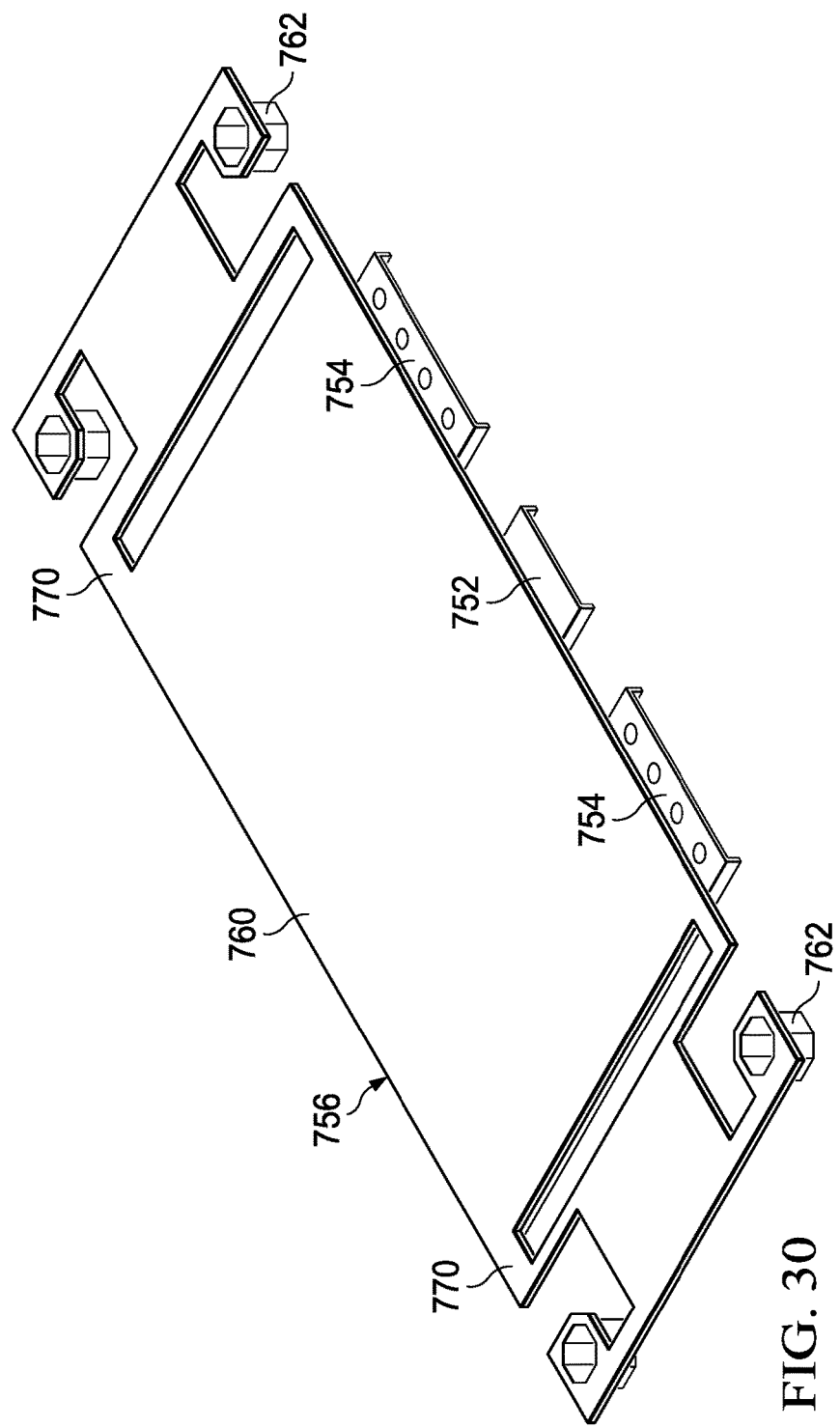

FIGS. 26 and 27 are top and perspective views of the arrangement 750 of FIG. 25, showing the generally rectangular membrane section 760 of the top plate including the serpentine fingers 764, and showing the relative placements of the bottom plate RF signal lines 754 and middle pull-in electrode 752. The S-shaped zig-zag contour of the serpentine fingers 764 provides greater temperature stability to the top plate membrane structure 760. FIGS. 26-27 also show the optional addition of raised bumps 768 on portions of the dielectric layer overlying the RF signal lines 754 to reduce contact area with the undersurface of the membrane 760 in the membrane-landed position.

Figure 31:
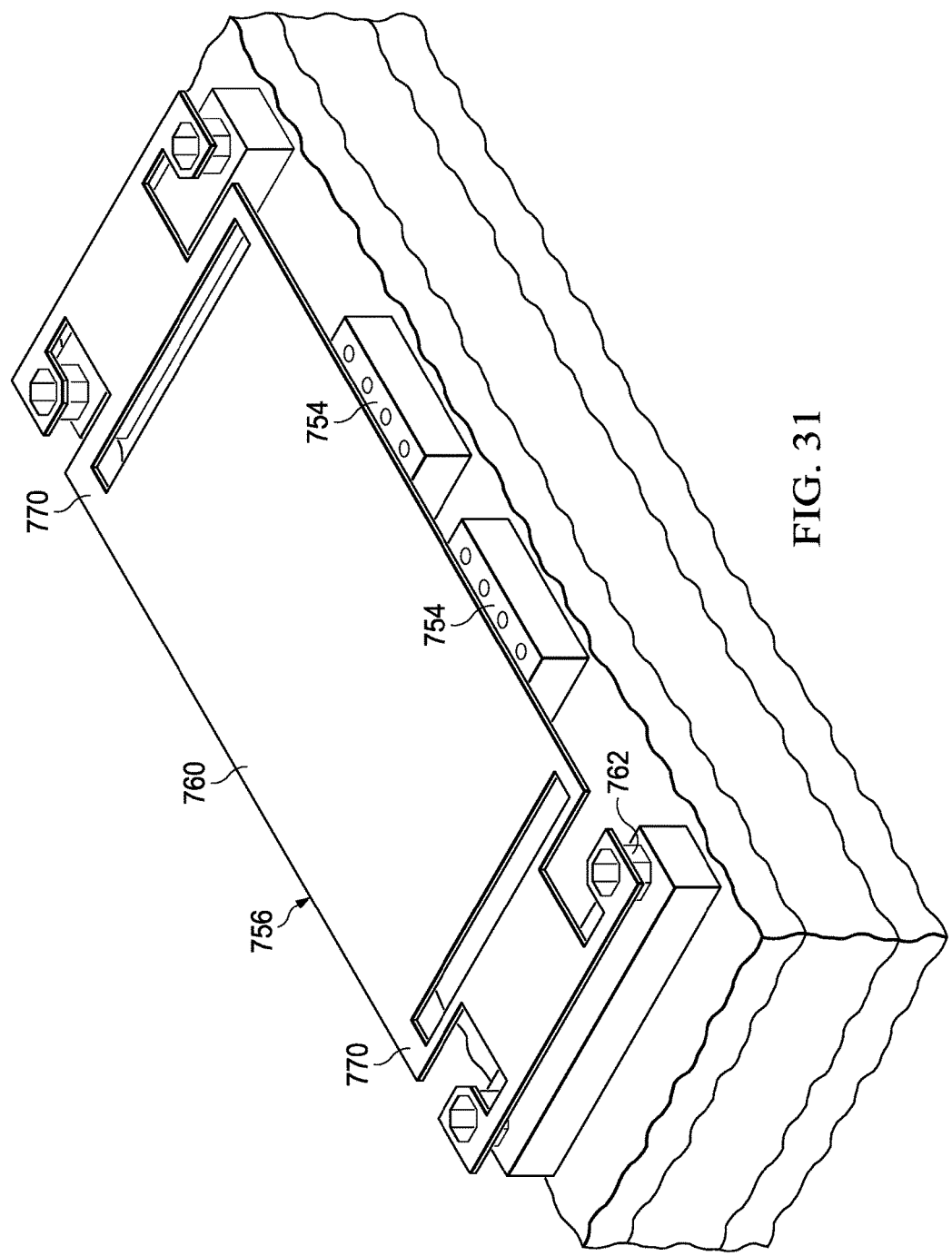
FIG. 31 is a perspective view of the actuator element of FIG. 28-30.

FIGS. 28-32 are views like those of FIGS. 25 and 26-27 showing a modified form of the structure of FIGS. 25 and 26-27, wherein cantilever spring connections 770 from corners of the rectangular membrane section 760 of the top plate 756 to anchor pin filled via supports 762 have a crab-like contour when viewed in the horizontal plane. In this configuration, the fingers of the cantilever spring connections 770 extend longitudinally outward a short distance, then turn laterally inward to join the laterally inward turn of the adjacent same end finger at a common longitudinally outward extending short rectangular segment, before turning laterally outward to connect at a longitudinally inwardly jutting tab to a respective one of the anchor posts. (FIG. 31 illustrates the relative positioning of the same membrane section configuration with crab springs over RF signal and bias electrodes, in a two-signal line implementation without the middle pull-in electrode.) The crab-like contour of FIGS. 28-31 may be considered an implementation of the serpentine structure created by joining the legs to increase the restoring force at the compromise of temperature stability.

Figure 32:
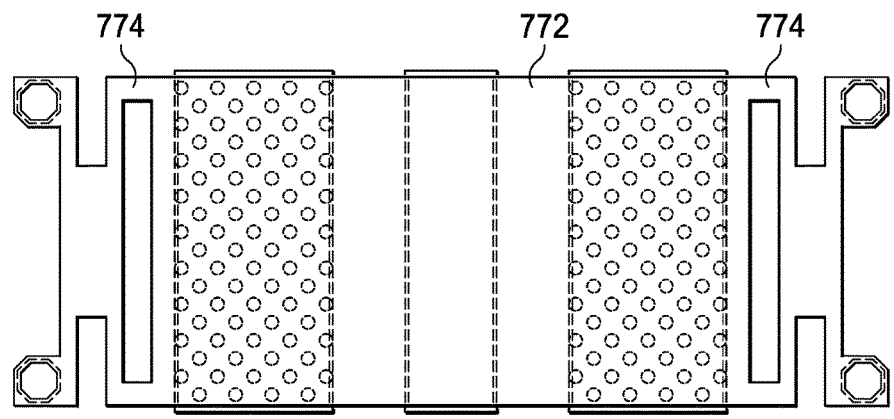
FIGS. 32-33 are top views illustrating further variations of the cantilever spring connection.

FIG. 32 is a top view illustrating a further variation of the cantilever spring connection. Here the top plate 772 has a configuration with crab-shaped spring fingers 774 similar to those of FIGS. 28-30, but wherein the short rectangular segment has a shorter longitudinal dimension, and the laterally outward turns following the shorter segment connect to the anchor posts at longitudinally outwardly turning, rather than inwardly turning, tabs.

Figure 33:
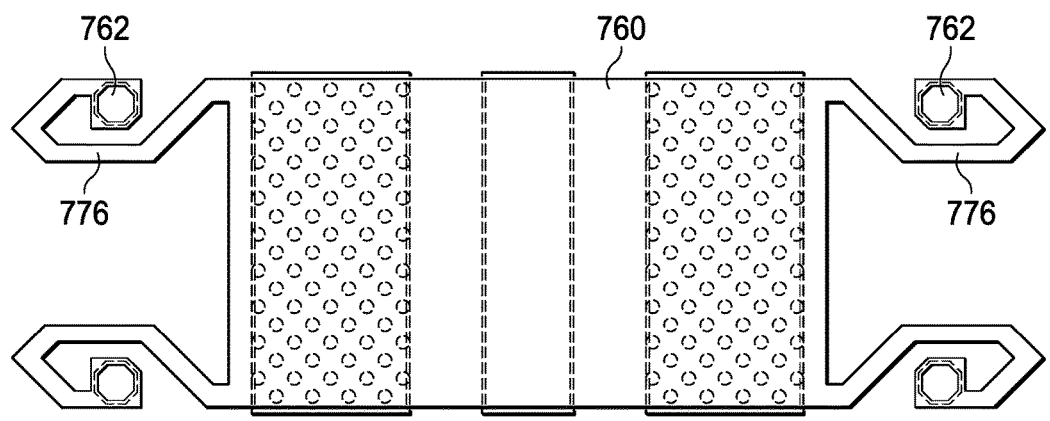

FIG. 33 is a top view illustrating a further variation of the cantilever spring connection. Here, the cantilever spring connections 776 from the corners of the rectangular membrane section 760 to the anchor pins 762 have a spiral (or shepherd's crook) contour when viewed in the horizontal plane. In this configuration, each finger extends away from a respective corner going longitudinally outward straight for a distance, then turning longitudinally outward/laterally inward diagonally for about one-quarter of the membrane width, then going longitudinally outward straight again for about twice the straight distance as before, then turning longitudinally outward/laterally outward diagonally for about one-eighth the membrane width, then longitudinally inward/laterally outward for about one-eighth the membrane width, before connecting at a longitudinally inwardly jutting tab to a respective one of the anchor posts. The spiral contour may provide good rotational stiffness for the indicated top plate topology.

Figure 34:
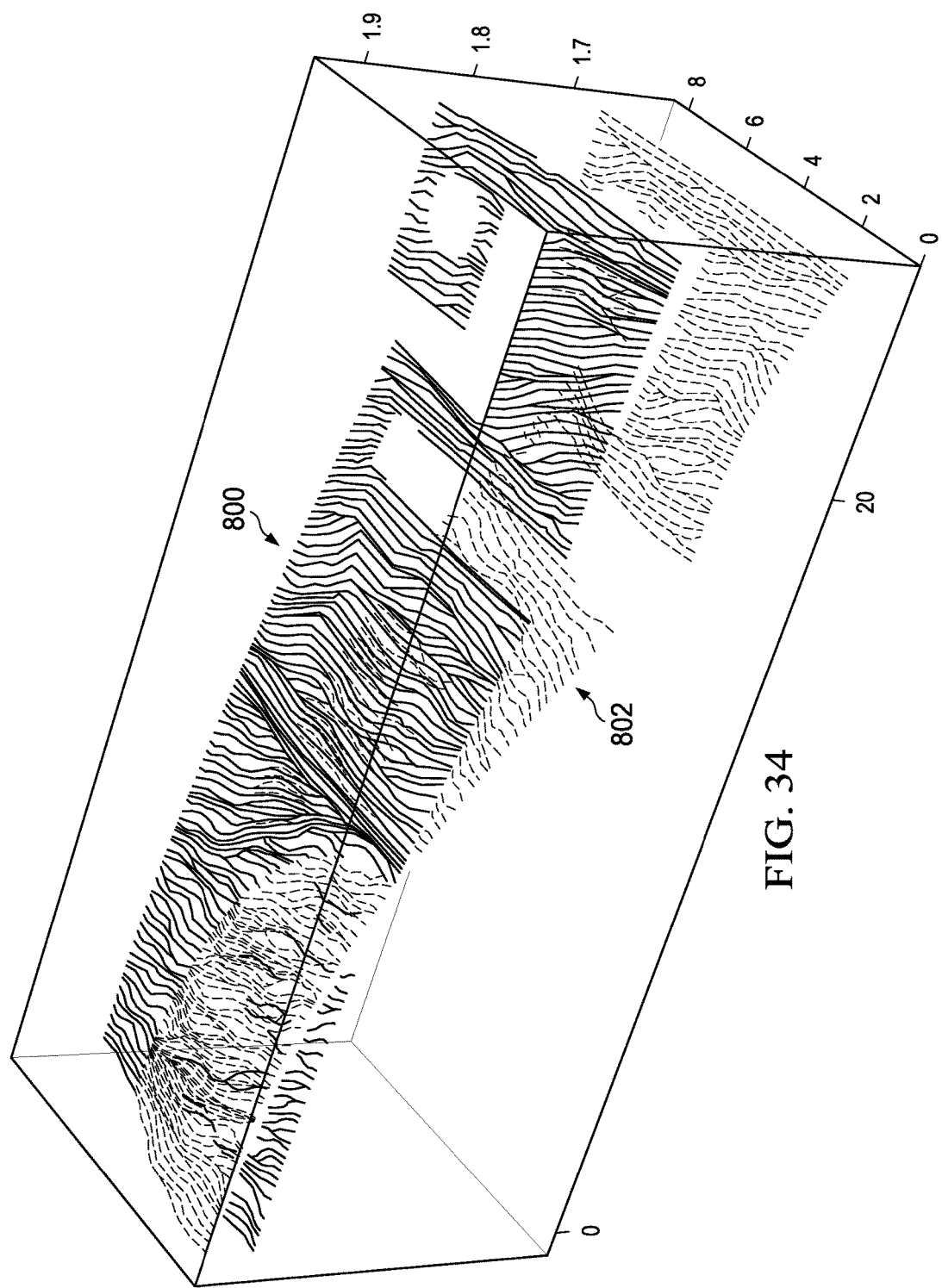
FIG. 34 is a partial perspective view of a regular and dome-shaped top plate for an actuator element.

In some implementations, it may be advantageous to perform the top plate with a centrally upwardly bowed pre-displacement configuration to assist landing/roll out, prevent stiction, etc. FIG. 34 illustrates both the baseline top plate configuration 800 and a dome-shaped top plate configuration 802 imparted by means of an inverse radius shape applied to the sacrificial layer prior to undercut for a top plate implementation having a rectangular membrane and crab-shaped end configuration.

It is noted that these and other features described in the context of specific example implementations/applications herein are not limited to those implementations/applications, and that the same may be applied separately and in various combinations in other implementations/applications, including but not limited implementations having the other arrangements/configurations described.

Those skilled in the art to which the subject matter hereof applies will appreciate that modifications may be made to the described embodiments, and that many other embodiments are possible, within the scope of this disclosure.

The invention claimed is:

1. A MEMS electrostatic actuator device, comprising:
    a CMOS wafer portion having CMOS circuitry;
    a MEMS wafer portion bonded to the CMOS wafer portion, the MEMS wafer portion having an array of actuator elements formed thereon and a plurality of through-silicon-vias (TSVs) extending through the MEMS wafer portion; and
    a plurality of ball bonds formed on a side of the MEMS wafer portion opposite the CMOS wafer portion, wherein an RF signal ball bond of the plurality of ball bonds is electrically connected through an RF signal TSV of the plurality of TSVs and an RF signal horizontal feeder bar to a plurality of RF signal lines, wherein the plurality of RF signal lines include one RF signal line extending through each column of the array of actuator elements.

2. The MEMS electrostatic actuator device of claim 1, further comprising a metal bond ring extending between the CMOS wafer portion and the MEMS wafer portion, the metal bond ring surrounding the array of actuator elements.

3. The MEMS electrostatic actuator device of claim 2, wherein a GND signal ball bond of the plurality of ball bonds is electrically connected through a GND TSV of the plurality of TSVs and the metal bond ring to the CMOS wafer portion to provide an RF grounding loop.

4. The MEMS electrostatic actuator device of claim 3, further comprising a ground shield on a side of the CMOS wafer portion facing the MEMS wafer portion, the ground shield extending over the entire array of actuator elements, wherein the ground shield is electrically connected to the metal bond ring and forms part of the RF grounding loop.

5. The MEMS electrostatic actuator device of claim 1, wherein the MEMS wafer portion includes a higher resistivity substrate relative to the CMOS wafer portion.

6. The MEMS electrostatic actuator device of claim 1, wherein the CMOS circuitry includes a serial interface controller, a decoder, a charge pump and a DC bias driver.

7. The MEMS electrostatic actuator device of claim 1, wherein the array of actuator elements are located in a hermetically sealed cavity.

8. The MEMS electrostatic actuator device of claim 1, wherein the plurality of ball bonds are arranged with all RF ball bonds on outside rows and a GND signal ball bond between adjacent RF ball bonds.

9. The MEMS electrostatic actuator device of claim 1, wherein each actuator element comprises:
    a bottom plate having a first electrode for a first RF signal line and a second electrode for a second RF signal line;
    a pedestal;
    a top electrode connected to the pedestal, the top electrode having a center membrane portion that extends over the first RF signal line and the second RF signal line; and
    a pair of cantilever hinges connected between the top electrode and an anchor on opposite ends of the center membrane portion, the pair of cantilever hinges allowing for movement of the center membrane portion closer to and further from the bottom plate.

10. The MEMS electrostatic actuator device of claim 9, wherein the top electrode has a pair of drive members extending from the center membrane on the opposite ends and wherein each actuator element further comprises a pair of drive out electrodes, each one of the pair of drive out electrodes extending under an associated one of the pair of drive members.

11. The MEMS electrostatic actuator device of claim 10, wherein each actuator element further includes a pull-in electrode between the first RF signal line and the second RF signal line.

12. A MEMS device, comprising:
    a CMOS wafer portion having CMOS circuitry;
    a MEMS wafer portion bonded to the CMOS wafer portion, the MEMS wafer portion having an array of elements formed thereon and a plurality of through-silicon-vias (TSVs) extending through the MEMS wafer portion; and a plurality of ball bonds formed on a side of the MEMS wafer portion opposite the CMOS wafer portion, wherein an RF signal ball bond of the plurality of ball bonds is electrically connected through an RF signal TSV of the plurality of TSVs and an RF signal horizontal feeder bar to a plurality of RF signal lines, wherein the plurality of RF signal lines include one RF signal line extending through each column of the array of elements.

13. The MEMS device of claim 12, further comprising a metal bond ring extending between the CMOS wafer portion and the MEMS wafer portion, the metal bond ring surrounding the array of elements.

14. The MEMS device of claim 13, wherein a GND signal ball bond of the plurality of ball bonds is electrically connected through a GND TSV of the plurality of TSVs and the metal bond ring to the CMOS wafer portion to provide an RF grounding loop.

15. The MEMS device of claim 14, further comprising a ground shield on a side of the CMOS wafer portion facing the MEMS wafer portion, the ground shield extending over the entire array of elements, wherein the ground shield is electrically connected to the metal bond ring and forms part of the RF grounding loop.

16. The MEMS device of claim 12, wherein the CMOS circuitry includes a serial interface controller, a decoder, a charge pump and a DC bias driver.

17. The MEMS device of claim 12, wherein the array of elements are located in a hermetically sealed cavity.

18. The MEMS device of claim 12, wherein the plurality of ball bonds are arranged with all RF ball bonds on outside rows and a GND signal ball bond between adjacent RF ball bonds.

19. The MEMS device of claim 12, wherein each element comprises:
    a bottom plate having a first electrode for a first RF signal line and a second electrode for a second RF signal line;
    a pedestal;
    a top electrode connected to the pedestal, the top electrode having a center membrane portion that extends over the first RF signal line and the second RF signal line; and
    a pair of cantilever hinges connected between the top electrode and an anchor on opposite ends of the center membrane portion, the pair of cantilever hinges allowing for movement of the center membrane portion closer to and further from the bottom plate.

\* \* \* \* \*